US009215009B2

(12) United States Patent
Mori

(10) Patent No.: US 9,215,009 B2
(45) Date of Patent: Dec. 15, 2015

(54) LIGHT OUTPUT CONTROL APPARATUS

(75) Inventor: Shota Mori, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1314 days.

(21) Appl. No.: 12/487,887

(22) Filed: Jun. 19, 2009

(65) Prior Publication Data

US 2009/0323173 A1 Dec. 31, 2009

(30) Foreign Application Priority Data

Jun. 25, 2008 (JP) ................................. 2008-165946

(51) Int. Cl.

| | |
|---|---|
| ***H01S 3/00*** | (2006.01) |
| ***H04B 10/291*** | (2013.01) |
| *H01S 3/094* | (2006.01) |
| *H01S 3/102* | (2006.01) |
| *H01S 3/13* | (2006.01) |
| *H01S 5/0683* | (2006.01) |

(52) U.S. Cl.

CPC ....... *H04B 10/2916* (2013.01); *H01S 3/094003* (2013.01); *H01S 3/094042* (2013.01); *H01S 3/1022* (2013.01); *H01S 3/1305* (2013.01); *H01S 5/0683* (2013.01)

USPC .... 359/337; 359/334; 359/337.13; 359/341.3

(58) Field of Classification Search

CPC .................... H01S 3/094003; H01S 3/094042; H01S 3/1002

USPC .......................... 359/341.3, 337, 337.13, 334

See application file for complete search history.

(56) References Cited

U.S. PATENT DOCUMENTS

| | | | | |
|---|---|---|---|---|
| 5,363,234 | A * | 11/1994 | Newhouse et al. | 359/341.32 |
| 5,892,615 | A * | 4/1999 | Grubb et al. | 359/341.31 |
| 6,256,138 | B1 * | 7/2001 | Huang | 359/337.2 |
| 6,532,107 | B2 * | 3/2003 | Yamaguchi et al. | 359/341.3 |
| 6,603,909 | B2 * | 8/2003 | Varner | 385/123 |
| 6,624,926 | B1 | 9/2003 | Hayashi | 359/334 |
| 6,891,661 | B2 | 5/2005 | Hayashi | 359/334 |
| 7,042,636 | B2 | 5/2006 | Hayashi | 359/439 |
| 7,362,499 | B2 | 4/2008 | Hayashi | 359/349 |
| 2002/0081086 | A1 * | 6/2002 | Varner | 385/123 |
| 2004/0120641 | A1 * | 6/2004 | Machewirth et al. | 385/29 |
| 2008/0158657 | A1 | 7/2008 | Muro | 359/334 |

FOREIGN PATENT DOCUMENTS

| | | |
|---|---|---|
| JP | 11-168255 | 6/1999 |
| JP | 2002-72262 | 3/2002 |

(Continued)

OTHER PUBLICATIONS

Notice of Reason for Rejection, mailed Jan. 13, 2012, in corresponding Japanese Application No. 2008-165946 (7 pages).

*Primary Examiner* — Mark Hellner
(74) *Attorney, Agent, or Firm* — Staas & Halsey LLP

(57) ABSTRACT

A light output control apparatus, includes:
- an excitation light source that outputs excitation light;
- an excitation light guiding unit that guides the excitation light to an optical amplifying medium for transmitting a signal light; and
- a loss causing unit that includes an optical transmission medium located between the excitation light source and the excitation light guiding unit, and changes a radius of curvature of the optical transmission medium.

8 Claims, 24 Drawing Sheets

(56) References Cited

FOREIGN PATENT DOCUMENTS

| | | |
|---|---|---|
| JP | 2005-354144 | 12/2005 |
| JP | 2007-147800 | 6/2007 |
| JP | 2008-164836 | 7/2008 |
| WO | 2007/036986 | 4/2007 |

* cited by examiner

LIGHT OUTPUT CONTROL APPARATUS

CROSS-REFERENCE TO RELATED APPLICATION

This application is based upon and claims the benefit of priority of the prior Japanese Patent Application No. 2008-165946, filed on Jun. 25, 2008 in the Japanese Patent Office, the entire contents of which are incorporated by reference.

FIELD

The embodiments discussed herein are related to, in a wavelength division multiplex optical transmission technology.

BACKGROUND

One of optical fiber amplifiers used for optical fiber communication is an optical fiber Raman amplifier (hereinafter referred to as Raman amplifier).

The Raman amplifier utilizes stimulated Raman effect which is a nonlinear phenomenon in an optical fiber connecting medium. The stimulated Raman effect is a phenomenon that when a substance is irradiated with light having a certain wavelength, light having the same wavelength is scattered, and scattered light having a changed wavelength is generated. For example, when excitation light is incident on the optical fiber connecting medium, scattered light having a wavelength shifted to a long wavelength side by approximately 100 nm compared with the wavelength of the excitation light is obtained. The Raman amplifier utilizes this phenomenon, and amplifies a signal light in the optical fiber connecting medium by guiding excitation light in the vicinity of 1,450 nm, which is a wavelength shifted by approximately 100 nm to a shorter wavelength side from 1,550 nm used as a wavelength band of the signal light.

The optical fiber connecting medium itself is used as an optical amplifying medium, and hence the Raman amplifier is distributed over a long distance to perform amplification, and the power of the signal light is maintained so as not to be reduced. As a result, a low-noise transmission distance can be lengthened. In addition, there is no limitation on an amplifying wavelength region, and hence amplification can be performed at any arbitrary wavelength by setting the wavelength of the excitation light.

FIG. 1 is a structural block diagram illustrating a conventional Raman amplifier. A level of main signal light, to which a loss is caused in an optical fiber connecting medium PL, is recovered owing to stimulated Raman effect of excitation light combined by a wave length division (WDM) coupler P2.

The excitation light is output from a semiconductor excitation laser (excitation laser diode (LD) P4 of FIG. 1, hereinafter referred to as excitation laser or excitation LD) which is an excitation light source. The excitation light is guided in a direction opposite to the transmission direction of the main signal light by the WDM coupler P2. A Raman amplifier P1 outputs the main signal amplified by the excitation light to a subsequent EDFA (not shown).

A gain (Raman gain, ON/OFF gain) of the Raman amplifier is expressed by the following expression on the assumption of a model in which the excitation light attenuates because of fiber loss, and the main signal light is influenced by the loss and the Raman gain.

[Mathematical Expression 1]

$$\text{Signal light } \frac{dP_s}{dz} = \frac{g_R}{A_{eff}} P_p P_s - \alpha_s P_s \quad \text{(Expression 1)}$$

[Mathematical Expression 2]

$$\text{Excitation light } \frac{dP_p}{dz} = -\alpha_p P_p \quad \text{(Expression 2)}$$

Reference symbol $P_s$ denotes signal light power, which is expressed in dBm. Reference symbol $P_p$ denotes excitation light power, which is expressed in dBm. The excitation light power is light output power of a semiconductor laser for Raman excitation, which is variable by control. Note that the variation in loss is observed in a connected portion to the optical fiber connecting medium for the excitation light, or an optical connector or a splice on the transmission line. Reference symbol $\alpha_s$ denotes a fiber loss of the signal light, which is expressed in dB/km. Reference symbol $\alpha_p$ denotes a fiber loss of the excitation light, which is expressed in dB/km. Each of $\alpha_s$ and $\alpha_p$ varies in a range of 0.2 to 0.35 dB/km depending on the optical fiber. Reference symbol $g_R$ denotes a Raman gain coefficient. The Raman gain coefficient is a physical property value and changed in accordance with the type of the optical fiber. That is, when the type of the optical fiber is determined, the Raman gain coefficient becomes substantially a constant value. Reference symbol $A_{eff}$ denotes an effective cross sectional area of the optical fiber, which is expressed in $\mu m^2$. The effective dross sectional area of the optical fiber is determined based on the type of the optical fiber.

Among them, the excitation light power $P_p$ and the fiber losses $\alpha_s$ and $\alpha_p$ greatly influence the gain of the Raman amplifier during actual operation. Expression 1 described above indicates that the gain of the Raman amplifier increases with the excitation light power $P_p$.

The excitation laser P4 of the Raman amplifier P1 has an upper limit value and a lower limit value for the excitation light which can be output (output power of excitation light). The upper limit value is a maximum output of the excitation laser. The lower limit value of the output power of the excitation light indicates a threshold value for stably supplying the excitation light. For example, when the excitation laser has a maximum output of 200 mW, it is necessary to use excitation laser at an output power equal to or larger than 40 mW.

Because of the upper limit value and the lower limit value of the output power of the excitation light from the excitation laser P4, a limitation is imposed on a variable gain range of the Raman amplifier P1. In other words, a Raman gain corresponding to the lower limit value of the output power of the excitation light from the excitation laser P4 is a minimum gain of the Raman amplifier P1, and a Raman gain corresponding to the upper limit value of the output power of the excitation light from the excitation laser P4 is a maximum gain of the Raman amplifier P1.

In order to widen the variable gain range of the Raman amplifier, the minimum gain of the Raman amplifier may be reduced. A method using an optical attenuator provided at an excitation light output (for example, Patent Document 1) may be employed as a method of reducing the minimum gain of the Raman amplifier. By using the method, in the case of the lower limit value of the output power of the excitation light, the excitation light power is reduced by the amount of attenuation of the optical attenuator, and hence the lower limit value of the excitation light power guided to the main signal can be reduced. When the lower limit value of the excitation light power reduces, the minimum gain of the Raman amplifier also becomes smaller. However, according to the method, not only in the case where the output power of the excitation light is the lower limit value but also in the case where the output power of the excitation light is the upper limit value, the same attenuation occurs. Therefore, the variable range of the excitation light power cannot be increased.

[Patent document 1] JP 11-168255 A

Therefore, such a Raman amplifier is desired in which an excitation light source stably operates in a case of a minimum gain, and a wide variable gain range can be obtained.

SUMMARY

According to an aspect of the invention, a light output control apparatus includes:

an excitation light source that outputs excitation light;

an excitation light guiding unit that guides the excitation light to an optical amplifying medium for transmitting a signal light; and a loss causing unit that includes an optical transmission medium located between the excitation light source and the excitation light guiding unit, and changes a radius of curvature of the optical transmission medium.

According to an aspect of the invention, a light output control apparatus may include:

a plurality of excitation light sources that output excitation lights having different wavelengths from one another;

a wave combining unit that combines the excitation lights from the plurality of excitation light sources;

a plurality of loss causing units, each of which includes an optical transmission medium located between each of the plurality of excitation light sources and the wave combining unit, and changes a radius of curvature of the optical transmission medium;

a plurality of excitation light detection units, each of which is located between each of the plurality of loss causing units and the wave combining unit, and detects an intensity of each of the excitation lights which are output from the plurality of excitation light sources and pass through the corresponding loss causing units;

an excitation light guiding unit that guides, to an optical amplifying medium for transmitting a signal light, the excitation light combined by the wave combining unit;

a light detection unit that detects an intensity of light passing through the optical amplifying medium; and a control unit that performs control such that the intensity of the light which is obtained from the light detection unit becomes a target value, based on the intensity of the light which is obtained from the light detection unit and the intensity of the each of the excitation lights from the respective excitation light sources, which is obtained from each of the plurality of excitation light detection units, wherein the control unit performs, when a control value of one of the excitation light sources is a lower limit value and the intensity of the light is larger than the target value, control to reduce a radius of curvature of the optical transmission medium in the corresponding loss causing unit to a value lower than a value in a normal state, and the control unit holds, when the control value of one of the excitation light sources is larger than the lower limit value, the radius of curvature of the optical transmission medium in the corresponding loss causing unit to a normal state.

According to an aspect of the invention, a disclosed light output control apparatus may include:

a plurality of excitation light sources that output excitation lights having different wavelengths from one another;

a wave combining unit that combines the excitation lights from the plurality of excitation light sources;

an excitation light guiding unit that guides, to an optical amplifying medium for transmitting a signal light, the excitation light combined by the wave combining unit;

a loss causing unit that includes an optical transmission medium located between the wave combining unit and the excitation light guiding unit, and changes a radius of curvature of the optical transmission medium;

a plurality of excitation light detection units, each of which is located between each of the plurality of excitation light sources and the wave combining unit, and detects an intensity of each of the excitation lights which are output from the plurality of excitation light sources;

a light detection unit that detects an intensity of light passing through the optical amplifying medium; and a control unit that performs control such that the intensity of the light which is obtained from the light detection unit becomes a target value, based on the intensity of the light which is obtained from the light detection unit and the intensity of the each of the excitation lights from the respective excitation light sources, which is obtained from each of the plurality of excitation light detection units, wherein the control unit performs, when a control value of a reference excitation light source among the plurality of the excitation light sources is a lower limit value, control to reduce a radius of curvature of the optical transmission medium in the loss causing unit to a value lower than a value in a normal state and to set the control value of the each of the plurality of excitation light sources at a predetermined ratio, and the control unit holds, when the control value of the reference excitation light source is larger than the lower limit value, the radius of curvature of the optical transmission medium in the loss causing unit in the normal state.

The object and advantage of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENT

Hereinafter, Raman amplifiers according to embodiments are described with reference to the drawings. Structures of the following embodiments are examples and thus Raman amplifiers are not limited to the structures of the embodiments.

<Connection Structure of Conventional Optical Amplifier>

In addition to a Raman amplifier, an erbium-doped fiber amplifier (hereinafter referred to as EDFA) is provided as an optical fiber amplifier.

The EDFA applies a light emitting of erbium (element symbol Er) which is a rare-earth element. The EDFA amplifies a signal light by excitation light incident on an erbium-doped optical fiber transmission line. The EDFA is an optical fiber amplifier which is higher in amplification efficiency than the Raman amplifier. However, the EDFA amplifies the signal light after being completely subjected to the loss in the optical fiber transmission line, and hence not only the signal light but also a noise included in the signal light are amplified. Therefore, A signal-to-noise ratio of the EDFA significantly deteriorates.

On the other hand, the Raman amplifier performs amplification in the optical fiber transmission line and starts amplification before a level of the signal light completely reduces, and hence the deterioration of a signal-to-noise ratio is small. However, the gain obtained by the Raman amplifier is lower than that obtained by the EDFA and thus more electrical power is consumed, and hence efficiency is low.

Therefore, a general structure is employed in which the EDFA is provided at the subsequent stage of the Raman amplifier. With this structure, a part of the loss caused by the optical fiber transmission line is compensated by the Raman amplifier and main signal light power is recovered by the EDFA. When the Raman amplifier is guided, a high signal-to-noise ratio can be maintained compared with a case of amplification using only the EDFA.

The EDFA has a main signal light power range suitable for input depending on product specifications suited for its use. Therefore, the Raman amplifier is requested to amplify the main signal to a level suitable for input to the EDFA.

Figure 1:
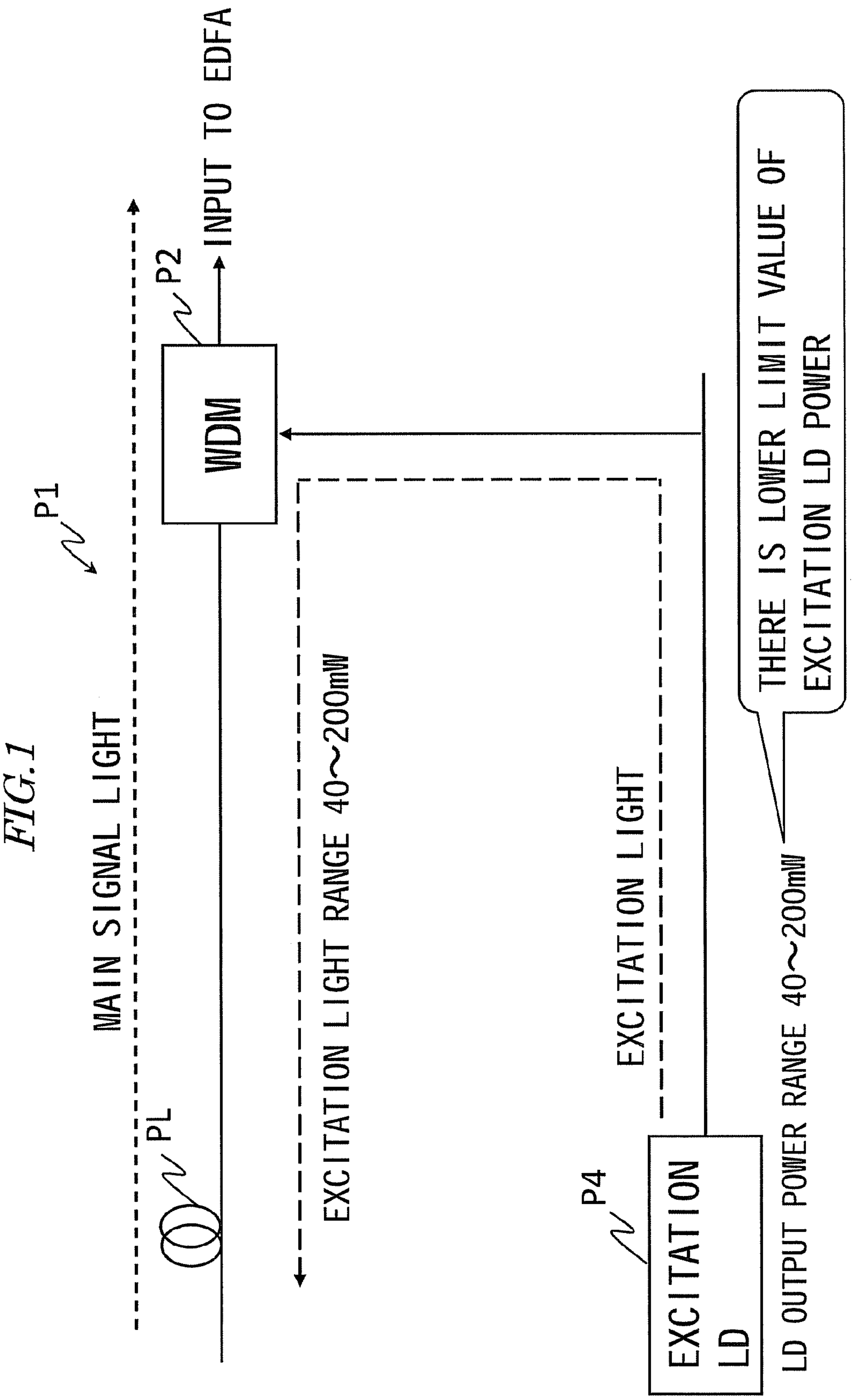
FIG. 1 is a diagram illustrating a conventional Raman amplifier.
Figure 2A:
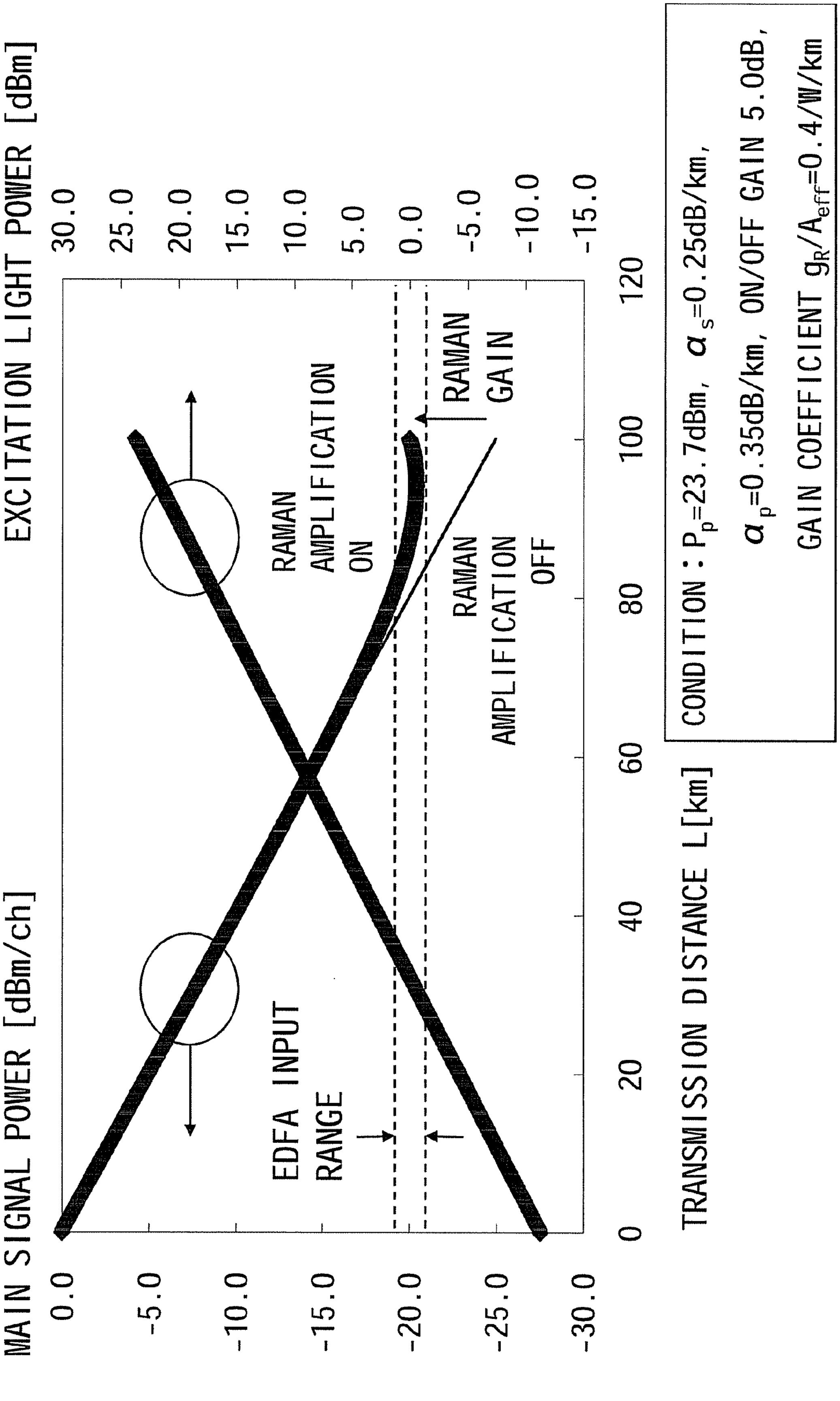
FIG. 2A is a diagram illustrating a result obtained by Raman gain simulation for a case where an excellent gain result is obtained.
Figure 2B:
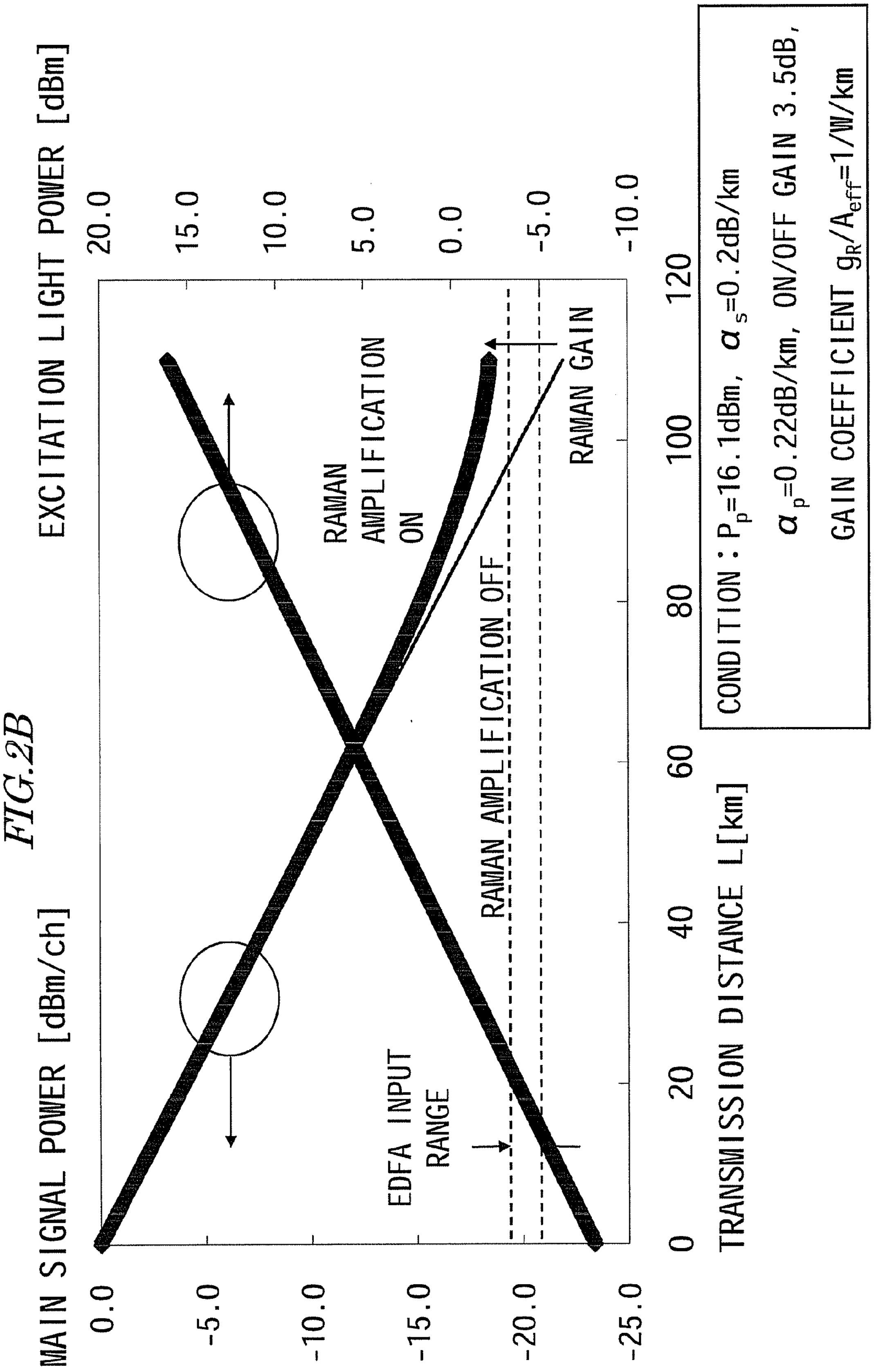
FIG. 2B is a diagram illustrating a result obtained by Raman gain simulation for a case where no excellent gain result is obtained.
Figure 2C:
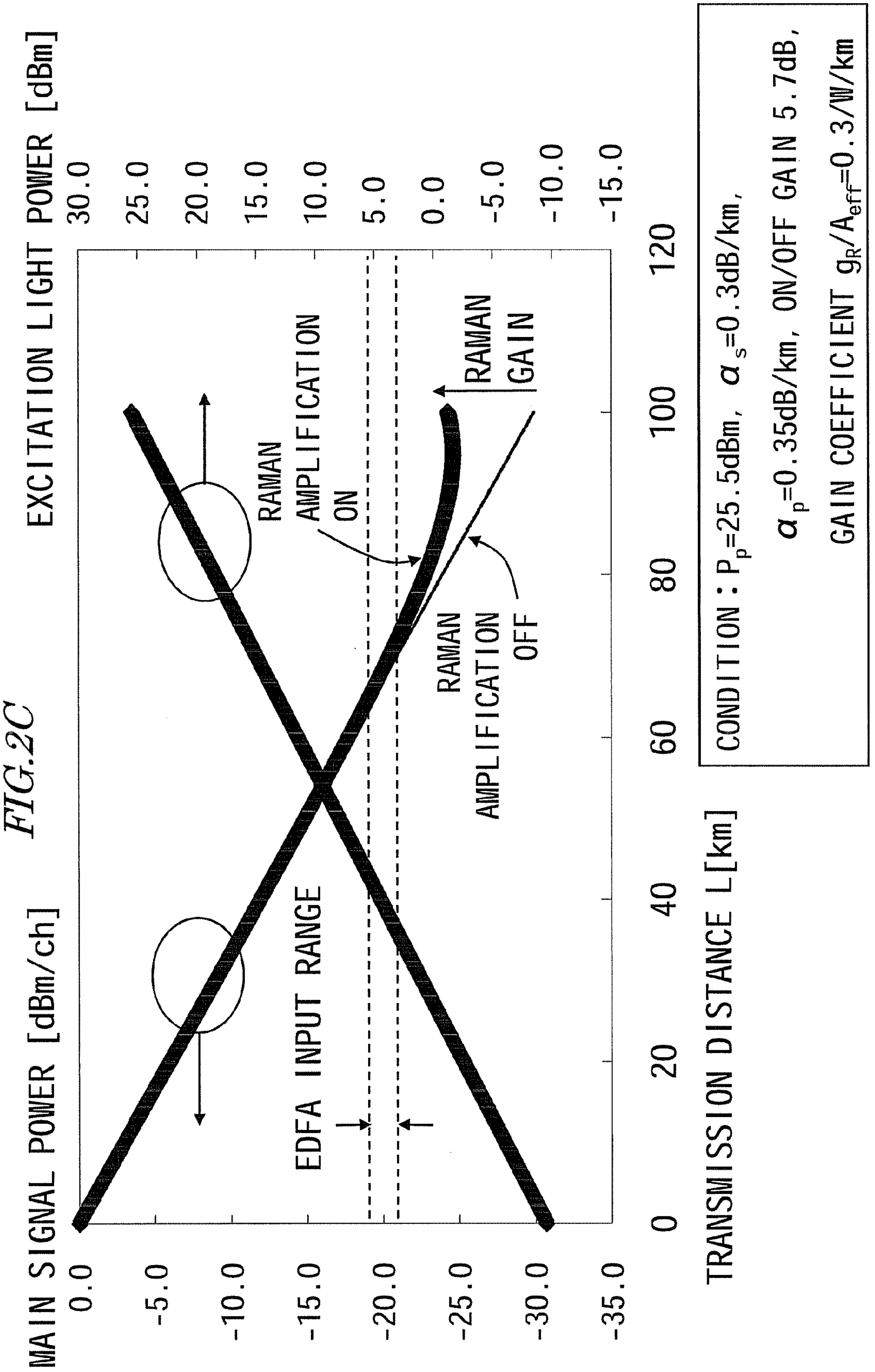
FIG. 2C is a diagram illustrating a result obtained by Raman gain simulation for a case where no excellent gain result is obtained.

FIGS. 2A, 2B, and 2C are graphs illustrating results obtained by Raman gain simulation. A case of each of FIGS. 2A, 2B, and 2C is based on the assumption that an optical amplifier is located at a transmission distance of 100 km.

The abscissa of the graph of each of FIGS. 2A, 2B, and 2C indicates a transmission distance of main signal light (units of km) and the ordinate thereof indicates main signal light power (units of dBm/ch) and excitation light power (units of dBm). A line whose value reduces more as the transmission distance increases is a line indicating the main signal light power. A thin line of the line indicating the main signal light power indicates main signal light power in a case where the Raman amplifier is not used, and a thick line thereof indicates main signal light power in a case where the Raman amplifier is used. A main signal light power difference between the thin line (case where the Raman amplifier is not used) and the thick line (case where the Raman amplifier is used) at the transmission distance of 100 km exhibits a Raman gain. A line whose value increases more as the transmission distance increases is a line indicating excitation light power. Excitation light for the Raman amplifier is guided in a direction opposite to the transmission direction of the signal light, and hence a line whose value is maximum at the transmission distance of 100 km and reduces as the transmission distance reduces is provided. Broken lines straightly extending in the lateral direction indicate an input range of the EDFA. The light indicating the main signal light power is requested to fall within the input range of the EDFA which is indicated by the broken lines at the transmission distance of 100 km. Respective parameter values in the case where the results as illustrated in the graphs of FIGS. 2A, 2B, and 2C are obtained are indicated in the respective drawings. According of the simulation in each of FIGS. 2A, 2B, and 2C, for the sake of simplification, the excitation light has only a single wavelength and a local loss caused by a connector is neglected.

FIG. 2A is a graph illustrating an example of Raman gain simulation in a case where an excellent result is obtained. The main signal light power amplified by the Raman amplifier at the transmission distance of 100 km is within the input range of the EDFA. The excitation light power in this case is a value between a lower limit value and an upper limit value. The Raman gain can be controlled by controlling the excitation light power (by controlling a driving current of the excitation light source in fact).

FIG. 2B is a graph illustrating an example of Raman gain simulation in a case where no excellent result is obtained. In FIG. 2B, because of a small optical fiber loss, even when the output power of the excitation light is set to a lower limit value, the Raman gain becomes excessively large and exceeds an upper limit of the input range of the EDFA located at the subsequent stage. In this case, because the Raman gain is excessively large, it is necessary to reduce the excitation light power in order to reduce the Raman gain. However, in the case of FIG. 2B, the output power of the excitation light is already the lower limit, and hence the excitation light power cannot be further reduced.

FIG. 2C is a graph illustrating an example of Raman gain simulation in a case where no excellent result is obtained. In FIG. 2C, because of a large optical fiber loss, even when the output power of the excitation light is set to an upper limit value, the Raman gain becomes insufficient and does not fall within the input range of the EDFA located at the subsequent stage. In this case, because the Raman gain is insufficient, it is necessary to increase the excitation light power in order to increase the Raman gain. However, in the case of FIG. 2C, the output power of the excitation light is already the upper limit, and hence the excitation light power cannot be further increased.

In the case as illustrated in FIG. 2C, a desirable Raman gain is not obtained because transmission line characteristics are too poor, and hence it is difficult to solve such a state by the Raman amplifier. In contrast to this, in the case as illustrated in FIG. 2B, the transmission line characteristics are excellent, and hence it is expected to solve the state by the Raman amplifier side.

It is necessary to reduce the Raman gain in order to solve the problem that, even when the output power of the excitation light is set to the lower limit value, the Raman gain becomes excessively large and exceeds the upper limit of the input range of the EDFA located at the subsequent stage as illustrated in FIG. 2B. In order to reduce the Raman gain, the excitation light power is reduced to be lower than the lower limit value of the output power of the excitation light.

From Expression 2, the excitation light power $P_p$ depends on the fiber loss $\alpha_p$. Therefore, in order to reduce the lower limit value of the excitation light power $P_p$, means for increasing the fiber loss $\alpha_p$ of the excitation light, which is inserted between the excitation laser P4 and the WDM coupler P2 in the Raman amplifier P1, is desired.

First Embodiment

<<Means for Increasing Fiber Loss of Excitation Light>>

Figure 3A:
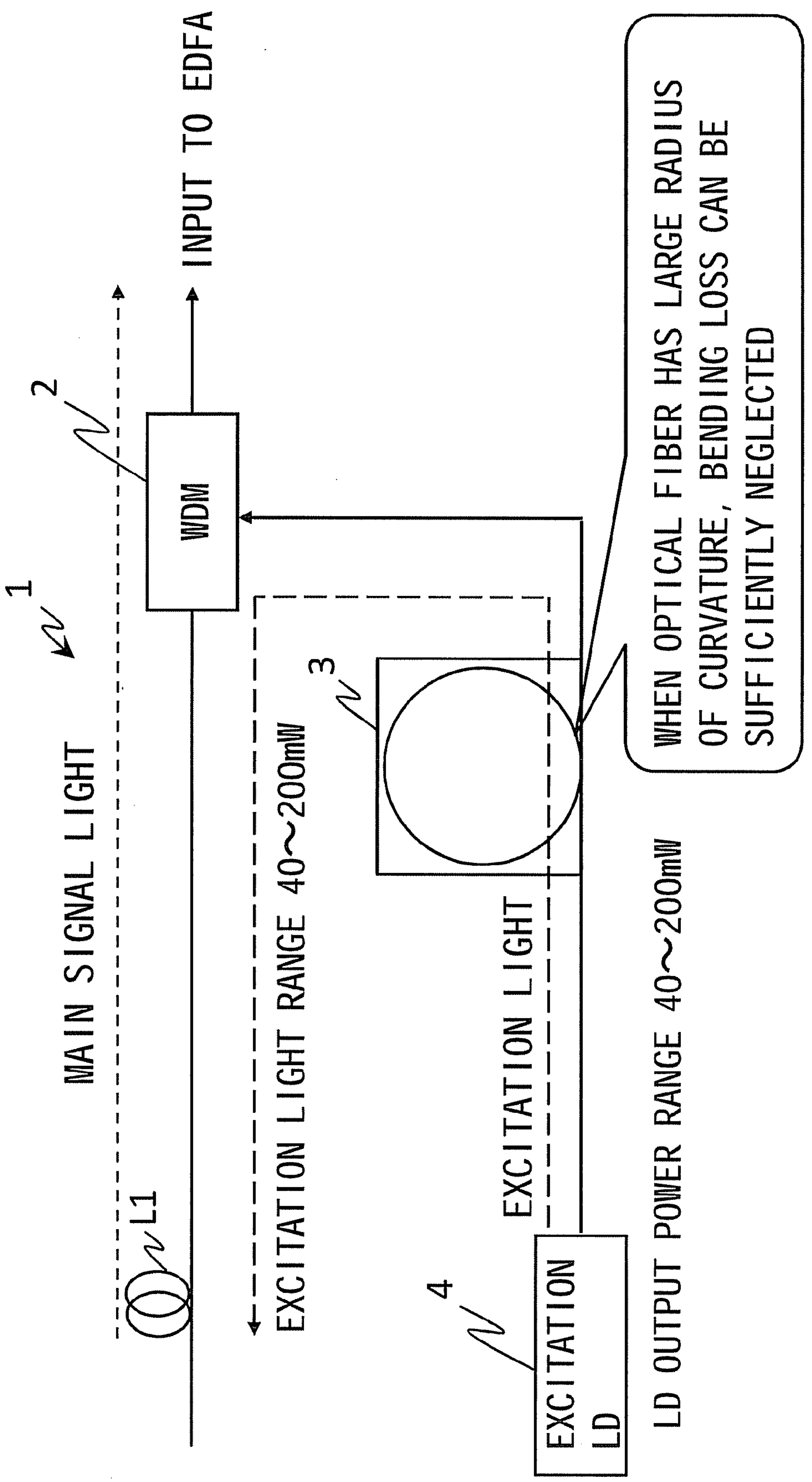
FIG. 3A is a diagram illustrating a structural example of a Raman amplifier.
Figure 3B:
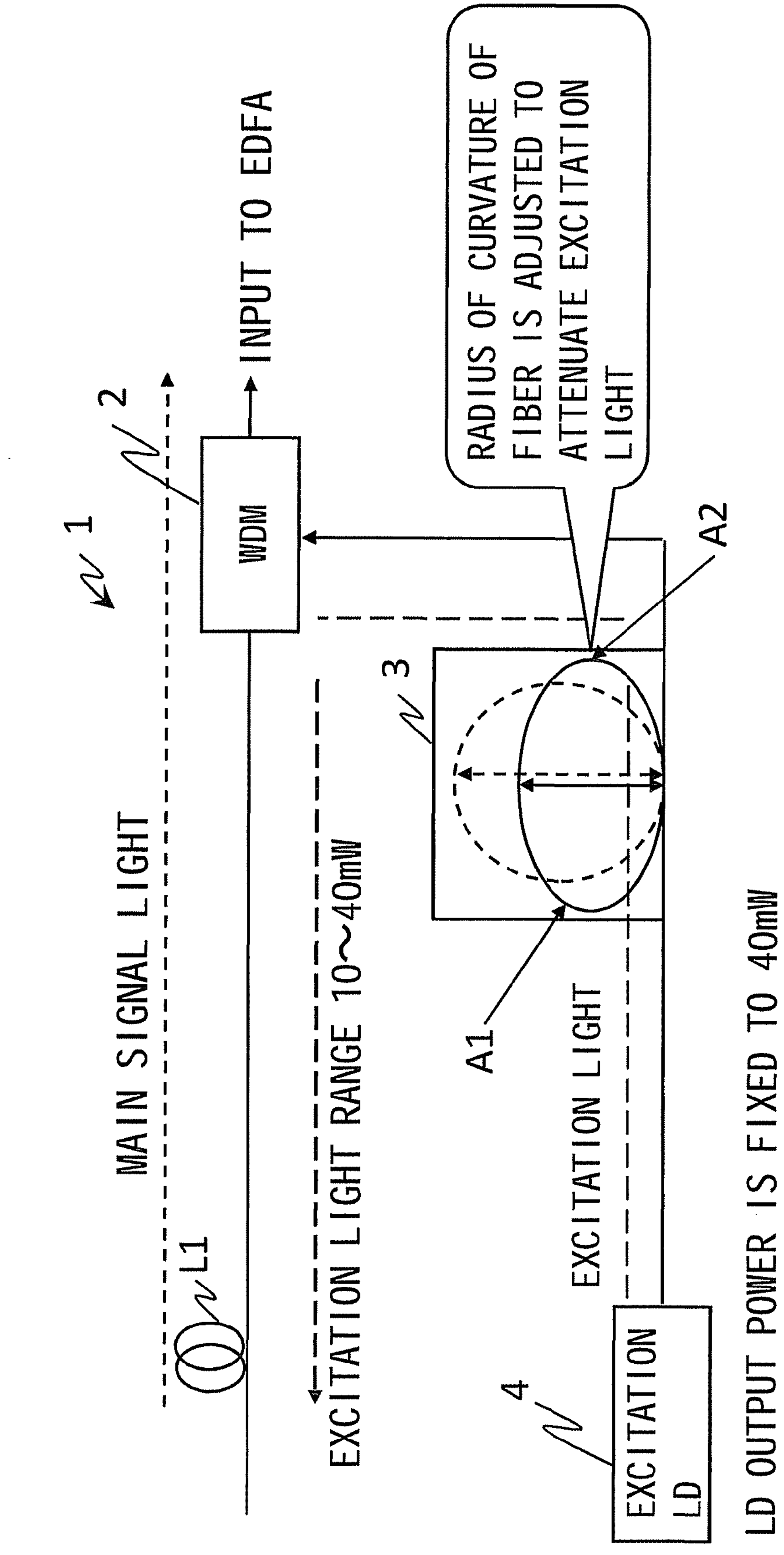
FIG. 3B is a diagram illustrating a structural example of the Raman amplifier.

FIGS. 3A and 3B are diagrams illustrating structural examples of a Raman amplifier including means for causing a loss to excitation light. A Raman amplifier 1 includes a WDM coupler 2 (corresponding to excitation light guiding unit), an excitation laser 4 (corresponding to excitation light source), and a loss causing unit 3 (corresponding to loss causing unit).

The WDM coupler 2 combines main signal light traveling through an optical fiber transmission line L1 (corresponding to optical amplifying medium) with excitation light. In the Raman amplifier 1, the excitation light is combined in a direction reverse to the transmission direction of the main signal light.

The excitation laser 4 outputs excitation light. Output power of the excitation light can be controlled based on a driving current of the excitation laser 4.

The loss causing unit 3 is provided between the excitation laser 4 and the WDM coupler 2 and causes losses to the excitation light which is not combined with the main signal light. FIG. 3A is a diagram illustrating an example of a Raman amplifier in which an optical fiber path between the excitation laser 4 and the WDM coupler 2 is formed in a circular shape to obtain the loss causing unit 3. In FIG. 3A, a diameter of the optical fiber (corresponding to optical transmission medium) path formed in the circular shape is set to such a value that an optical fiber bending loss (hereinafter referred to as bending loss) can be sufficiently neglected (for example, 30 mm). In other words, in the loss causing unit 3 which is in the state of FIG. 3A, the bending loss caused in the excitation light can be neglected.

FIG. 3B is a diagram illustrating an example of a Raman amplifier in which the optical fiber path of the loss causing unit 3, which formed in the circular shape, is deformed into a flattened elliptical shape. As illustrated in FIG. 3B, the circular-shaped optical fiber of FIG. 3A is distorted to increase the bending loss. In other words, in the case of FIG. 3B, there are portions (indicated by arrows A1 and A2 in FIG. 3B) each of whose radius of curvature of the optical fiber path is smaller than that in the case of FIG. 3A. When the radius of curvature of the path is equal to or smaller than a predetermined value, the bending loss of the optical fiber significantly increases. When the bending loss increases, the power of the excitation light guided to the main signal light is reduced by the loss.

<<Structural Example of Loss Causing Unit>>

Figure 4A:
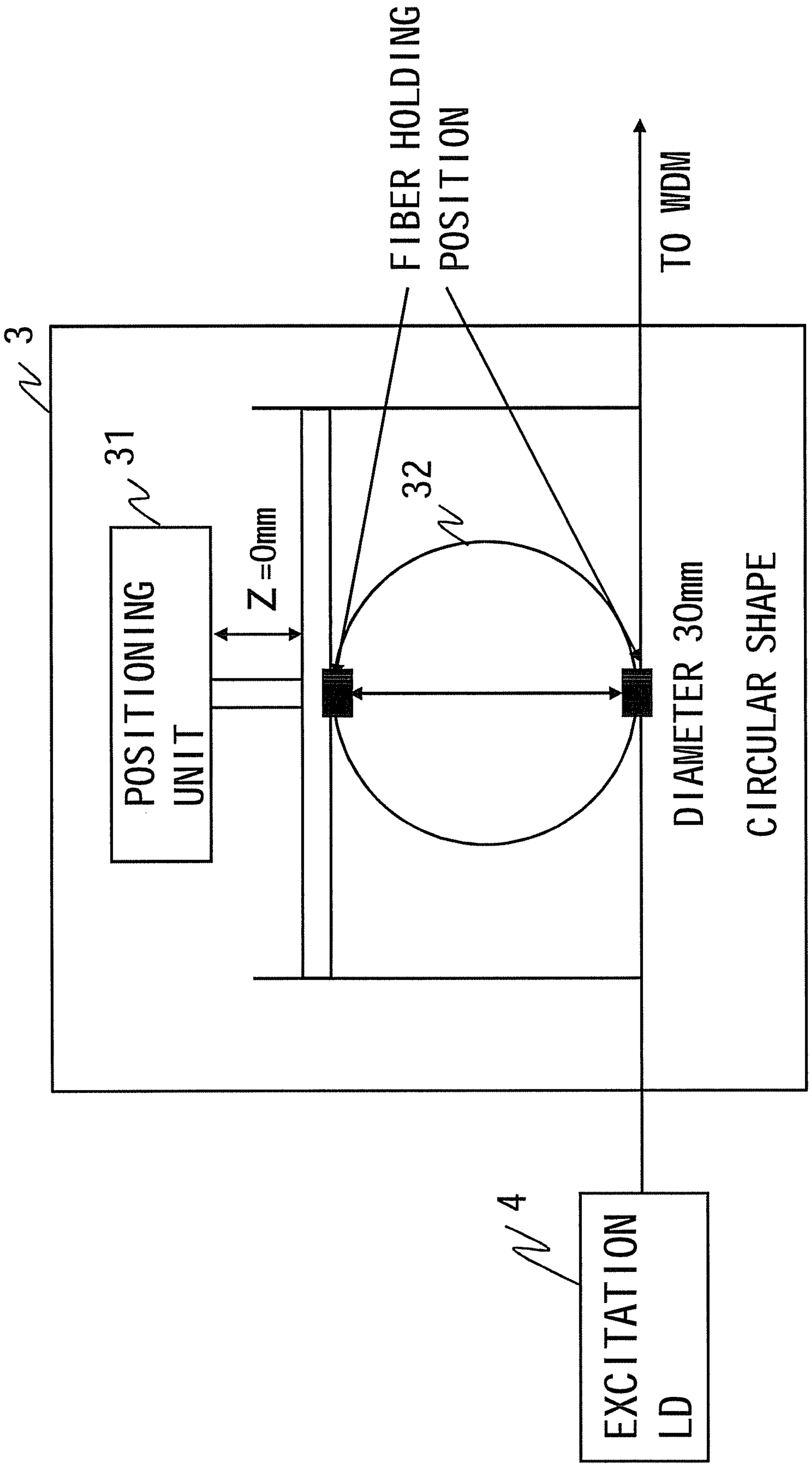
FIG. 4A is a diagram illustrating a structural example of a loss causing unit.
Figure 4B:
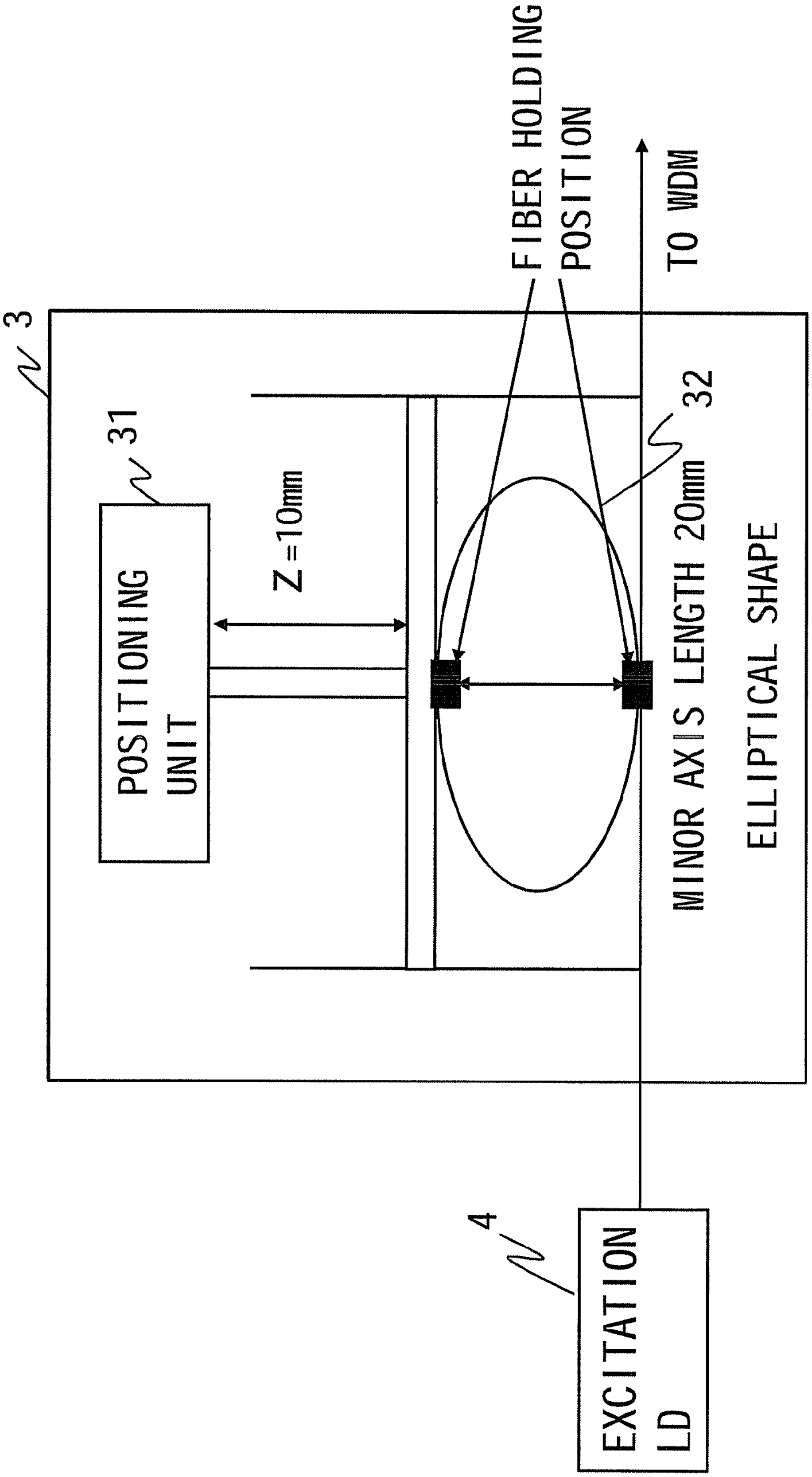
FIG. 4B is a diagram illustrating a structural example of the loss causing unit.

FIGS. 4A and 4B are diagrams illustrating a structural example of the loss causing unit 3. The loss causing unit 3 includes a positioning unit 31 and a fiber bending unit 32. The fiber bending unit 32 is an optical fiber whose path is wound once to be formed in the circular shape. In the fiber bending unit 32, one portion of the circular-shaped optical fiber is fixed to a box of the Raman amplifier 1 and the other portion opposed thereto is fixed to the positioning unit 31.

The positioning unit 31 compresses the fiber bending unit 32. FIG. 4A illustrates a state in which the diameter of the fiber bending unit 32 is set to 30 mm (positioning unit 31 does not extend nor retract (FIG. 4A: Z=0 mm)) and thus the bending loss can be sufficiently neglected. FIG. 4B illustrates a state in which the positioning unit 31 extends by 10 mm (FIG. 4B: Z=10 mm) and thus the fiber bending unit 32 is deformed in an elliptical shape whose minor axis length is 20 mm, thereby significantly increasing the bending loss. Hereinafter, the minor axis length of the elliptical shape in the case where the fiber bending unit 32 is compressed and deformed is referred to as a fiber bending minor axis length. Therefore, when the fiber bending minor axis length is changed by the loss causing unit 31, the radius of curvature of the optical fiber is reduced to increase the bending loss caused in the excitation light, thereby controlling the power of the excitation light guided to the main signal light. When the fiber bending minor axis length is controlled, a minimum radius of curvature of the path can be controlled to control a level of the bending loss caused in the excitation light.

The positioning unit 31 and the fiber bending unit 32 are preferably arranged on the same flat surface such as a substrate of the Raman amplifier 1. With the arrangement on the flat surface, the positioning unit 31 can control the extension and retraction be realized only in a single axis direction. The positioning unit 31 is preferably configured using, for example, a servo motor or a stepping motor. When the servo motor or the stepping motor is used, the fine control of μm order is possible. In the control of mm order, sufficient precision can be ensured.

<<Control Method of Excitation Light Power>>

Hereinafter, the power of the excitation light output from the excitation laser 4 is referred to as "output power", and the power of the excitation light immediately before the excitation light passes through the loss causing unit 3 and is input to the WDM coupler 2 is referred to as "excitation light power".

Figure 5:
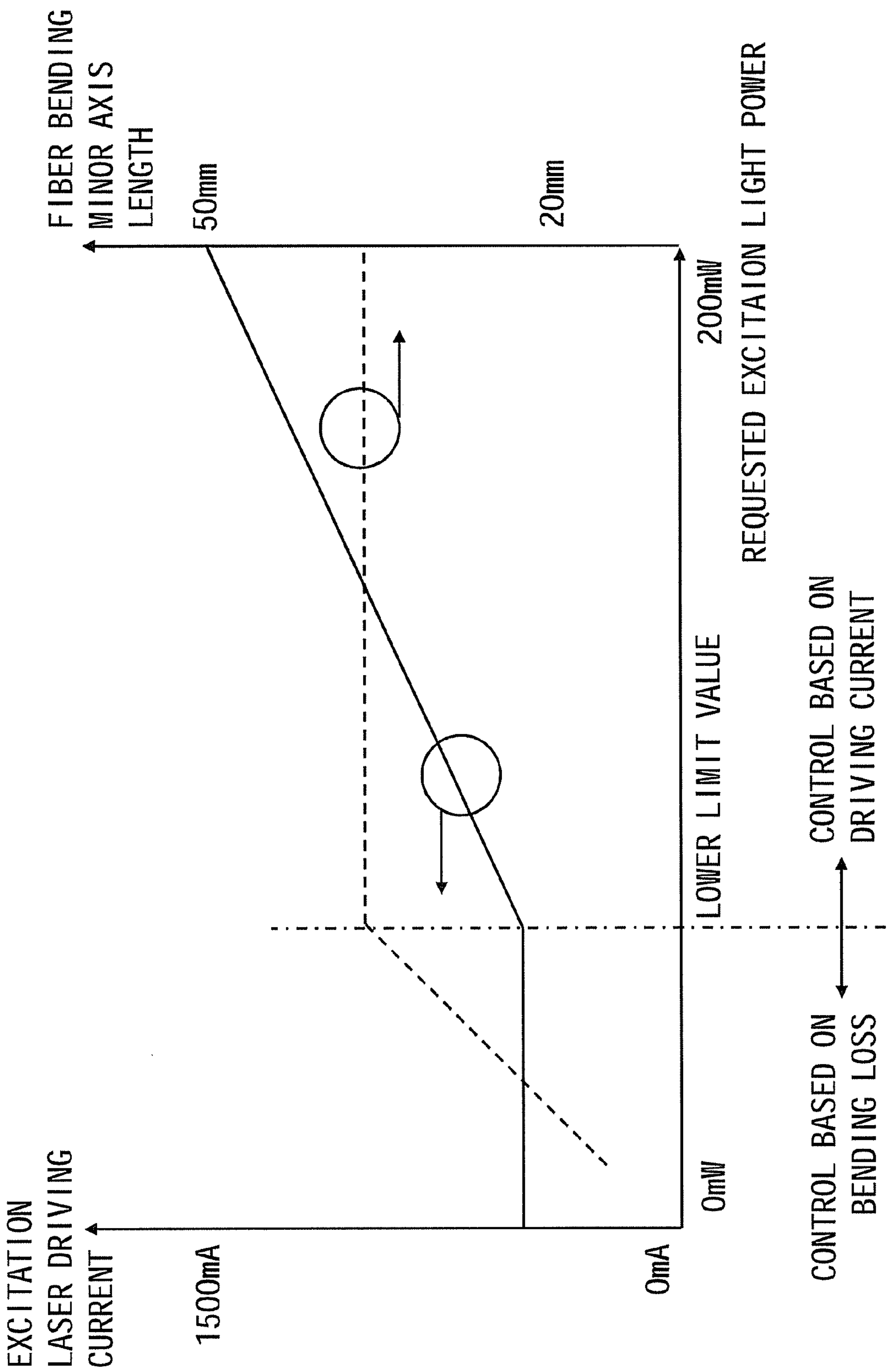
FIG. 5 is a graph illustrating an example of a method of controlling excitation light power based on a driving current and a bending loss.

FIG. 5 is a graph illustrating a method of controlling the excitation light power based on a driving current value (corresponding to control value) of the excitation laser 4 and the fiber bending minor axis length. The abscissa of the graph indicates the excitation light power (units of mW). The ordinate of the graph indicates an excitation LD driving current value (units of mA) and the fiber bending minor axis length (units of mm). A single line in the graph of FIG. 5 represents a relationship between the excitation light power and the excitation LD driving current. A broken line in the graph of FIG. 5 represents a relationship between the excitation light power and the fiber bending minor axis length. A longitudinal line in FIG. 5 indicates a lower limit value of the output power of the excitation light.

According to the control method as illustrated in the graph of FIG. 5, whether the excitation light power is controlled based on the driving current of the excitation laser 4 or the fiber bending minor axis length is determined depending on whether or not the excitation light power is equal to or larger than the lower limit value of the output power of the excitation light.

According to the method of controlling the excitation light power as illustrated in FIG. 5, in a range in which the excitation light power is equal to or larger than the lower limit value of the output power, the state in which the fiber bending loss in the loss causing unit 3 can be sufficiently neglected (states of FIGS. 3A and 4A) is maintained, and the driving current of the excitation laser 4 is controlled to control the excitation light power. In a range in which the excitation light power is smaller than the lower limit value of the output power, the fiber bending minor axis length is controlled to control the excitation light power. Therefore, in the graph of FIG. 5, when the excitation light power increases in the range in which the excitation light power is equal to or larger than the lower limit value of the output power, the excitation LD driving current increases and the fiber bending minor axis length exhibits a constant value (fiber bending minor axis length at which bending loss can be sufficiently neglected). On the other hand, when the excitation light power reduces in the range in which the excitation light power is smaller than the lower limit value of the output power, the fiber bending minor axis length reduces and the excitation LD driving current exhibits a constant value (current value corresponding to lower limit value of output power of excitation light).

<<Linearization of Bending Loss Based on Fiber Bending Minor Axis Length>>

Figure 6A:
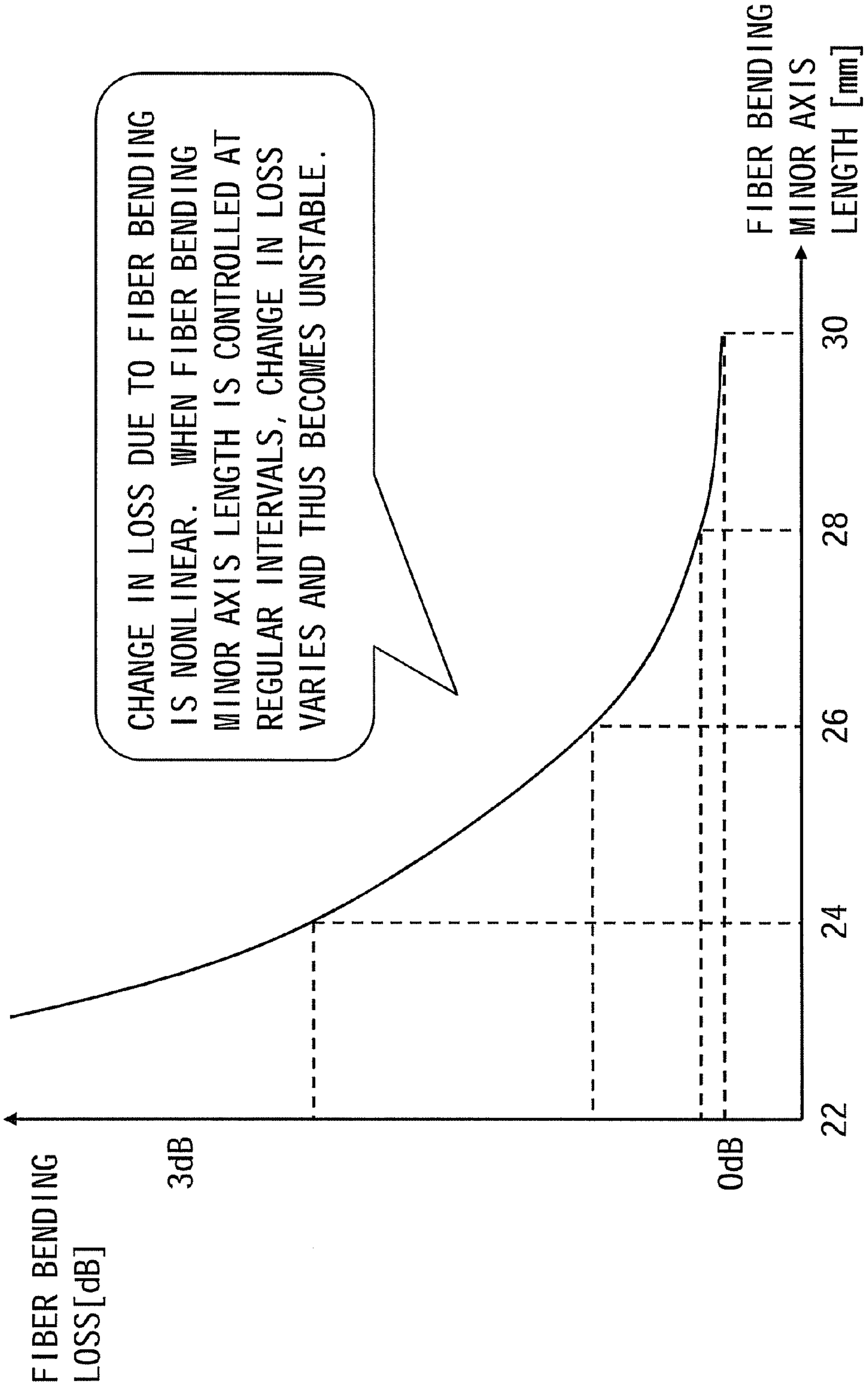
FIG. 6A is a graph illustrating an example of a relationship between a fiber bending minor axis length and a bending loss.

FIG. 6A is a graph illustrating a relationship between the fiber bending minor axis length and the bending loss based on the fiber bending minor axis length. In FIG. 6A, the bending loss in the case where the fiber bending minor axis length is 30 mm which is the length at which the bending loss can be sufficiently neglected is set as a reference value (0 dB). As illustrated in the graph of FIG. 6A, the fiber bending minor axis length and the bending loss based on the fiber bending minor axis length have a nonlinear relationship. In a range in which the fiber bending minor axis length is large, the bending loss hardly changes. In contrast to this, in a range in which the fiber bending minor axis length is small, the bending loss rapidly changes. Therefore, when the fiber bending minor axis length is controlled at regular intervals, a change in loss varies, and hence an unstable state is caused.

Figure 6B:
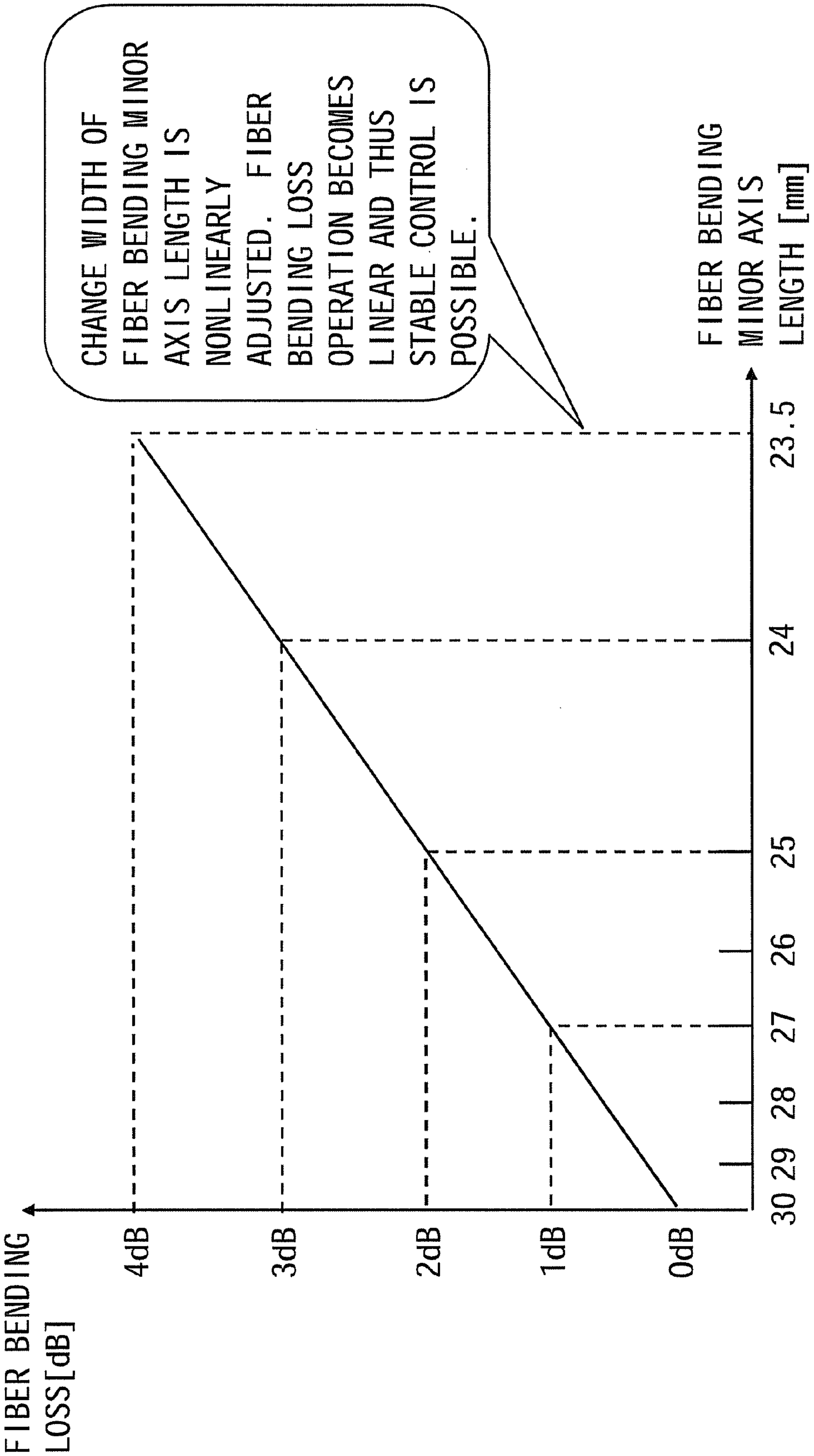
FIG. 6B is a graph illustrating an example of a linear relationship between the fiber bending minor axis length and the bending loss.

FIG. 6B is a graph obtained by non-linearized the graph of FIG. 6A to change the bending loss at regular intervals according to the change in the fiber bending minor axis length. Therefore, the bending loss becomes linear, and hence the stable control can be performed.

Structural Example of First Embodiment

Figure 7:
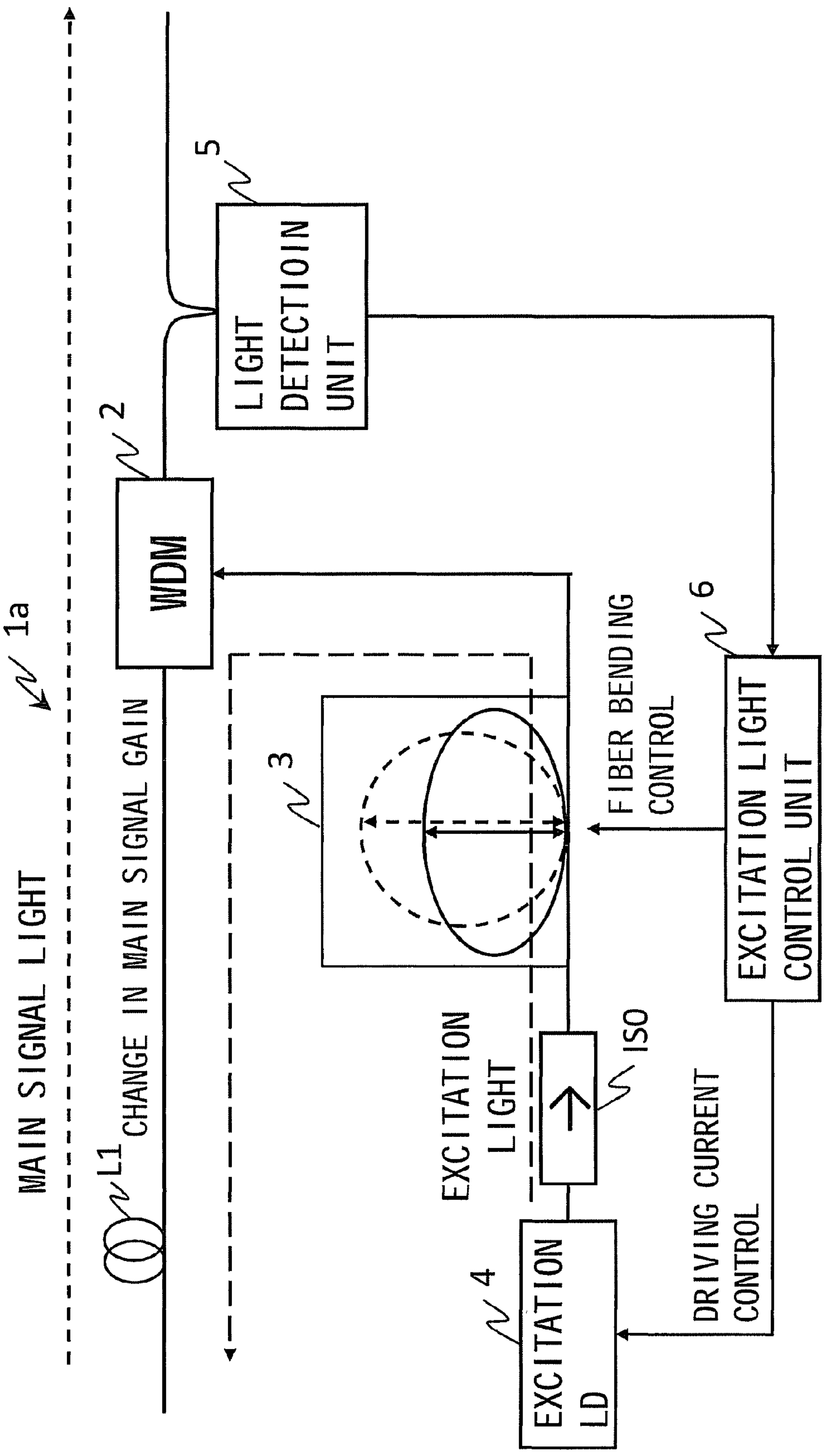
FIG. 7 is a diagram illustrating a structural example of a first embodiment.

FIG. 7 is a block diagram illustrating a structural example of a Raman amplifier according to a first embodiment. A Raman amplifier 1*a* includes the WDM coupler 2, the loss causing unit 3, the excitation laser 4, a light detection unit 5, an excitation light control unit 6, and an isolator ISO. Assume that the loss causing unit 3 is the loss causing unit 3 illustrated in FIGS. 3A, 3B, 4A, and 4B.

In the Raman amplifier 1*a*, in order to prevent the excitation light output from the excitation laser 4 from oscillating due to reflection, the isolator IS is provided at the output of the excitation laser 4. The excitation light passes through the isolator 4 and the loss causing unit 3 and is guided to the main signal light by the WDM coupler 2. In the Raman amplifier 1*a*, the light detection unit 5 (corresponding to light detection unit) measures the power of the main signal light to which the excitation light is guided by the WDM coupler 2 for amplification. In the Raman amplifier 1*a*, a measurement value of the power of the main signal light is fed back to the excitation light control unit 6 to control the excitation light power such that the power of the main signal light becomes a desirable value. At this time, when the excitation light power is equal to or larger than the lower limit value of the output power of the excitation laser 4, the driving current value of the excitation laser 4 is controlled to control the excitation light power. When the excitation light power is smaller than the lower limit value of the output power of the excitation laser 4, the fiber bending minor axis length of the loss causing unit 3 is controlled to control the excitation light power.

The excitation laser 4 is configured using, for example, a module including a semiconductor laser. The light detection unit 5 is a photo detector and configures using, for example, a photo detector with tap in which an optical coupler branching a part of light power and a photo detector for measuring light power are integrated.

Figure 8:
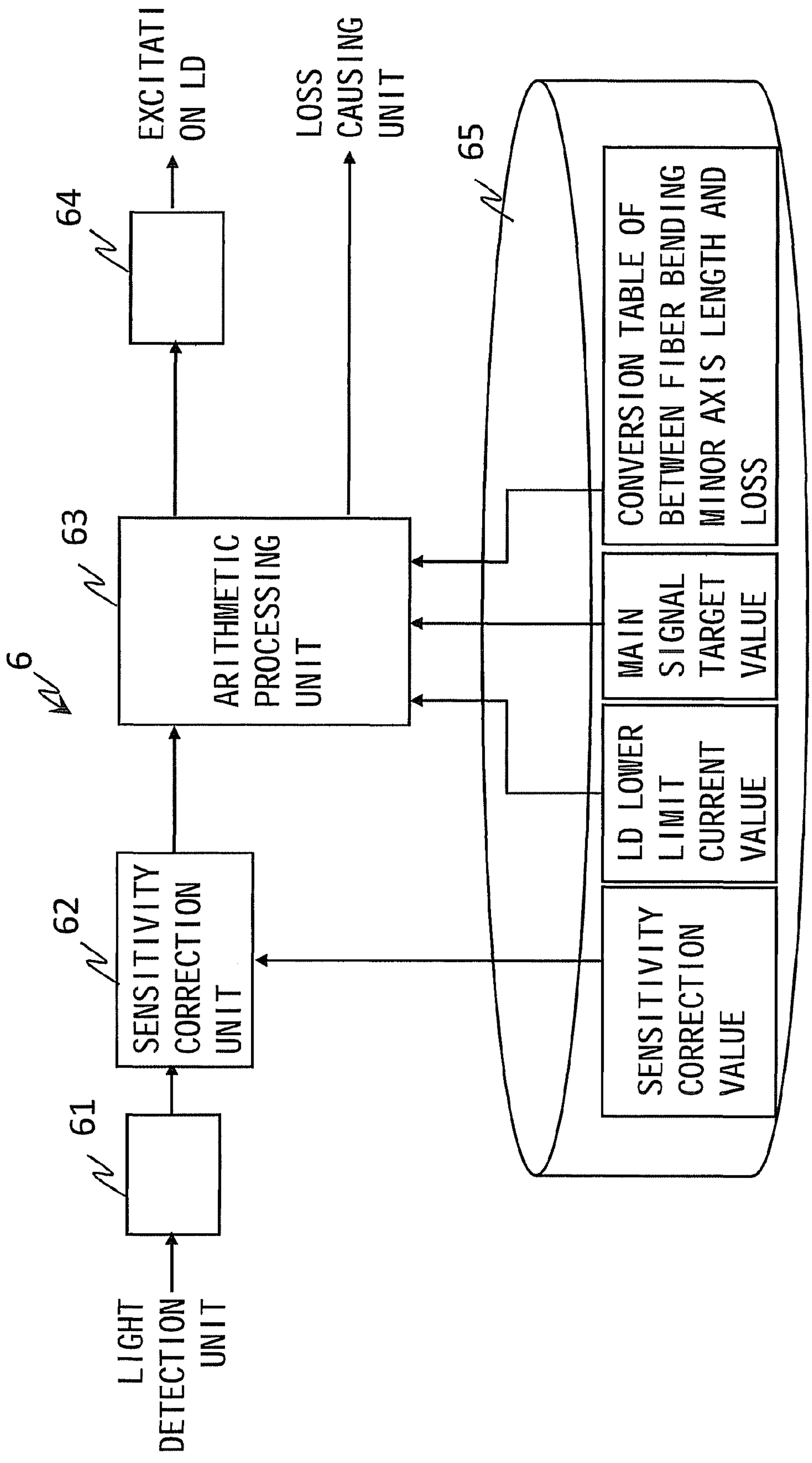
FIG. 8 is a diagram illustrating a structural example of an excitation light control unit.

FIG. 8 is a block diagram illustrating a structural example of the excitation light control unit 6 (corresponding to control unit). The excitation light control unit 6 includes an AD converter 61, a light detection sensitivity correction unit 62, an arithmetic processing unit 63, a DA converter 64, and a storage unit 65.

The storage unit 65 stores a sensitivity correction value, a lower limit current value of the excitation laser 4, a target value of the power of the main signal light, and a conversion table between the fiber bending minor axis length and the bending loss. The sensitivity correction value is a value specific to a photo detector, which is used in the light detection unit 5 to correct a sensitivity error. The lower limit current value of the excitation laser 4 is a current value corresponding to the lower limit value of the output power of the excitation laser 4. The target value of the power of the main signal light is assumed to be, for example, an upper limit value of an input range of the EDFA provided at the subsequent stage of the Raman amplifier 1*a*. The conversion table between the fiber bending minor axis length and the bending loss is a table obtained in advance by measurement, for example, a table as illustrated in FIG. 6B. The storage unit 65 is configured using, for example, a random access memory (RAM).

The AD converter 61 converts an analog signal from the light detection unit 5 into a digital signal. The analog signal from the light detection unit 5 is a signal indicating the measurement value of the power of the main signal light.

The light detection sensitivity correction unit 62 receives the measurement value of the power of the main signal light from the AD converter 61 and corrects an error of the light detection unit 5 based on the sensitivity correction value stored in the storage unit 65.

The arithmetic processing unit 63 receives the measurement value of the power of the main signal light from the light detection sensitivity correction unit 62. The driving current of the excitation LD 4 and the fiber bending minor axis length of the loss causing unit 3 are controlled such that the measurement value becomes closest to a main signal target value. A control method performed by the arithmetic processing unit 63 is described later. The light detection sensitivity correction unit 62 and the arithmetic processing unit 63 are configured using, for example, a CPU mounted on the Raman amplifier 1*a*.

The DA converter 64 converts a digital signal indicating the driving current value of the excitation LD 4 from the arithmetic processing unit 63 into an analog signal. The analog signal is input to a current control circuit of the excitation LD 4.

Figure 9A:
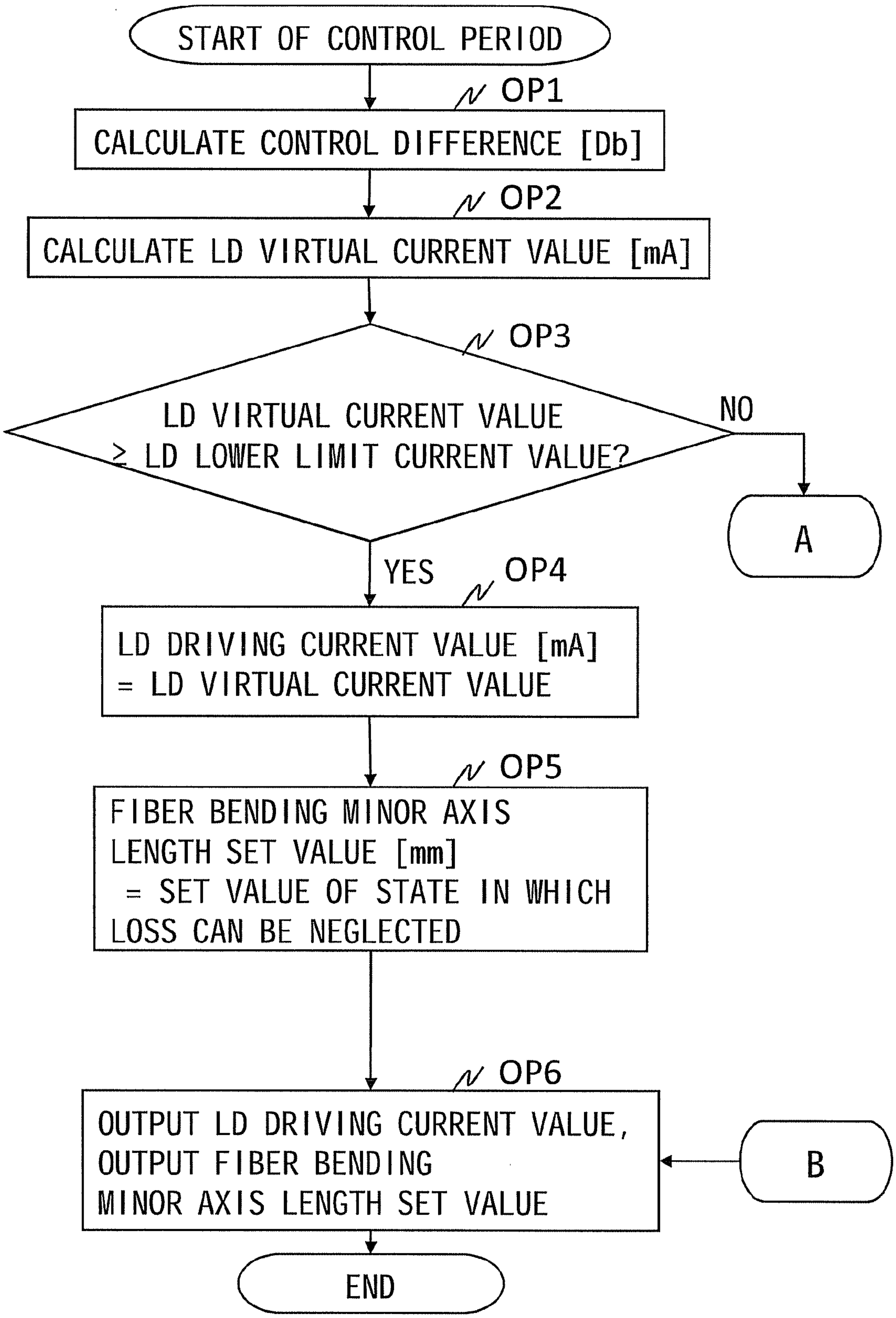
FIG. 9A is a flow chart illustrating an example of a method of controlling an excitation laser driving current value and the fiber bending minor axis length.
Figure 9B:
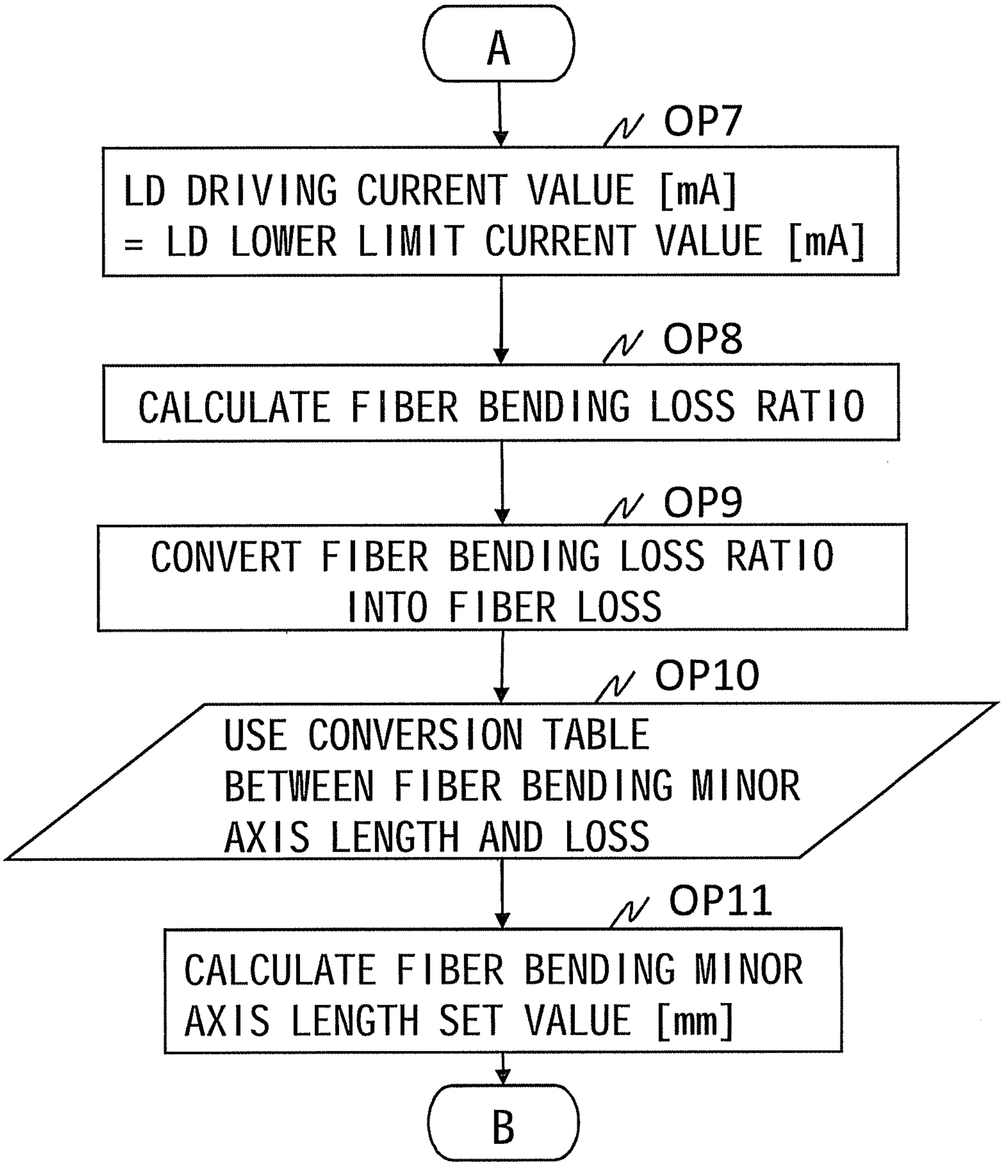
FIG. 9B is a flow chart illustrating an example of a method of controlling an excitation laser driving current value and the fiber bending minor axis length.

FIG. 9 is a flow chart illustrating an example of the control method performed by the arithmetic processing unit 63. The arithmetic processing unit 63 repeats the control illustrated in FIG. 9 at constant intervals (for example, interval of 100 ms).

The arithmetic processing unit 63 calculates, as a control difference, a difference between the main signal target value stored in the storage unit 65 and the measurement value of the power of the main signal light (hereinafter referred to as main signal measurement value) (OP1). The control difference is regarded as a difference between excitation light power in the case where the power of the main signal light which is the main signal target value is obtained as an amplification result and excitation light power in the case where the main signal power at the time of measurement of the main signal light is obtained as an amplification result. The control difference is calculated by the following Expression 3.

[Mathematical Expression 3]

Control difference [dBm]=main signal target value [dBm]−main signal measurement value [dBm] (Expression 3)

Next, an LD virtual current value is calculated from the control difference (OP2). The LD virtual current value is a virtual value of the driving current of the excitation laser 4. The LD virtual current value is a virtual value and thus may be a value smaller than the lower limit value of the driving current (current value corresponding to lower limit value of output power, hereinafter referred to as LD lower limit current value) of the excitation laser 4. The LD virtual current value is calculated by the following Expression 4.

[Mathematical Expression 4]

LD virtual current value [mA]=LD virtual current value [mA]+control coefficient [mA/dBm]×control difference [dBm] (Expression 4)

The control coefficient is a coefficient for converting, into a current value, a control difference obtained from a result of simulation performed in advance.

Next, whether or not the obtained LD virtual current value is equal to or larger than the LD lower limit current value is determined (OP3). When the LD virtual current value is equal to or larger than the LD lower limit current value, processing goes to Step OP4 for controlling the driving current value of the excitation laser 4 to control the excitation light power, thereby controlling the Raman gain. When the LD virtual current value is smaller than the LD lower limit current value, processing goes to Step OP7 for controlling the fiber bending minor axis length of the loss causing unit 3 to control the excitation light power, thereby controlling the Raman gain.

When the LD virtual current value is equal to or larger than the LD lower limit current value (OP3: Yes), the driving current value of the excitation laser 4 (hereinafter referred to as LD driving current value) is set to the LD virtual current value calculated in Step OP3 (OP4). When the excitation light power is controlled based on the LD driving current value, loss is not generated in the loss causing unit 3. Therefore, a fiber bending minor axis length set value is set to a value at which the bending loss can be sufficiently neglected (for example, fiber bending minor axis length of 30 mm in the case of FIG. 4A) (OP5).

The LD driving current value obtained in Step OP4 is transmitted to the excitation laser 4 and the fiber bending minor axis length set value obtained in Step OP5 is transmitted to the loss causing unit 3 (OP6).

On the other hand, in Step OP3, when the LD virtual current value is smaller than the LD lower limit current value (OP3: No), the LD driving current value is set to the LD lower limit current value (OP7).

Next, the fiber bending minor axis length set value is calculated. First, a fiber bending loss ratio is calculated by the following Expression 5 (OP8).

[Mathematical Expression 5]

$$\text{Fiber bending loss ratio} = \frac{LD\ \text{virtual current value} - Ith}{LD\ \text{lower limit current value} - Ith} \quad \text{(Expression 5)}$$

where Ith denotes an oscillation threshold value of the excitation laser 4.

The fiber bending loss ratio is converted into the bending loss (OP9). The bending loss is obtained by performing decibel conversion of the fiber bending loss ratio. For example, in the case where the calculated fiber bending loss ratio is 0.2, when decibel conversion of 0.2 is performed, approximately −3 dB is obtained. In other words, the bending loss of 3 dB is obtained.

When the bending loss is obtained, the fiber bending minor axis length set value is calculated using the conversion table between the fiber bending minor axis length and the bending loss, which is stored in the storage unit 65 (OP10). For example, in the case of the conversion table illustrated in FIG. 6B, a corresponding fiber bending minor axis length is 24 mm because the bending loss obtained in Step OP9 is 3 dB. Therefore, in this case, the obtained fiber bending minor axis length set value is 24 mm.

The LD driving current value obtained in Step OP7 is transmitted to the excitation laser 4 and the fiber bending minor axis length set value obtained in Step OP10 is transmitted to the loss causing unit 3 (OP6).

The control as described above is repeated by the arithmetic processing unit 63 of the excitation light control unit 6 at constant time intervals.

In the first embodiment, the means for changing the radius of curvature of the path of the optical fiber serving as the transmission medium to increasing the loss is employed as means for causing a loss to the excitation light. Up to now, the bending loss of the optical fiber causes the reduction in gain, and hence attention has been focused on how to eliminate the bending loss. However, in the first embodiment, the excitation light power is set to a value smaller than the lower limit value by the positive use of the fiber bending loss which is regarded as a negative element up to now. As a result, the Raman gain range can be widened.

In the Raman amplifier 1*a* according to the first embodiment, when the driving current of the excitation laser 4 is the lower limit value (when the output power of the excitation laser 4 is the lower limit value), the fiber bending minor axis length of the fiber bending unit 32 of the loss causing unit 3 is shortened to change the radius of curvature of the optical fiber. When the radius of curvature of the optical fiber becomes smaller, the bending loss in the excitation light increases, and hence the minimum output power of the excitation light can be reduced. Therefore, it is possible to solve the problem that, even when the output power of the excitation light is set to the lower limit value, the Raman gain becomes excessively large and exceeds the upper limit of the input range of the EDFA located at the subsequent stage.

Second Embodiment

A second embodiment includes a structure common to the first embodiment, and thus different points are mainly described and description of common points are omitted.

In the first embodiment, the optical fiber path of the fiber bending unit 32 of the loss causing unit 3 is wound once to be formed in the circular shape. Instead of the structure, in the second embodiment, the optical fiber path of the fiber bending unit 32 of the loss causing unit 3 is wound a plurality of times to be formed in the circular shape.

Figure 10:
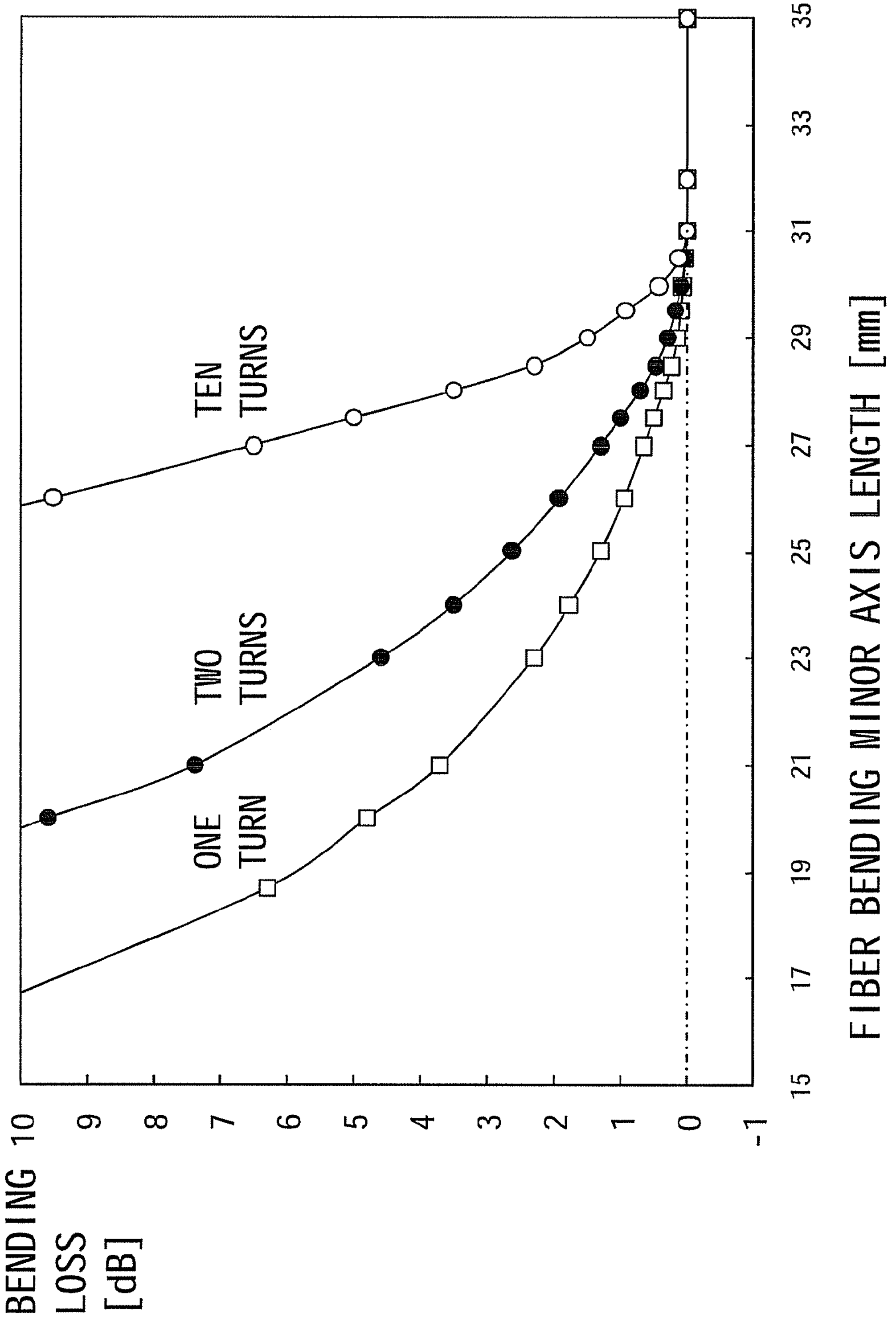
FIG. 10 is a graph illustrating an example of a relationship between the fiber bending minor axis length and the bending loss for each number of turns.

FIG. 10 is a graph illustrating a relationship between the fiber bending minor axis length and the bending loss in each number of turns of the fiber bending unit 32. As is apparent from FIG. 10, as the number of turns increases, the bending loss is significantly increased by a smaller amount of reducing the fiber bending minor axis length. For example, when the optical fiber is wound 10 times, loss ten times that in the case of one turn is obtained (see the vicinity of a point at which the fiber bending minor axis length is 26 mm in FIG. 10). When the fiber bending minor axis length is to be reduced to significantly increase the bending loss, a problem concerning reliability may occur. However, when the number of turns of the optical fiber path increases, a variable loss width can be widened while the reliability is maintained.

Third Embodiment

A third embodiment includes a structure common to the first embodiment, and thus different points are mainly described and description of common points are omitted.

In the first embodiment, the loss causing unit 3 has a set including the positioning unit 31 and the fiber bending unit 32 in which the optical fiber path is wound once to be formed in the circular shape. Instead of the structure, in this third embodiment, the loss causing unit 3 has a plurality of sets each including the fiber bending unit 32 and the positioning unit 31.

Figure 11:
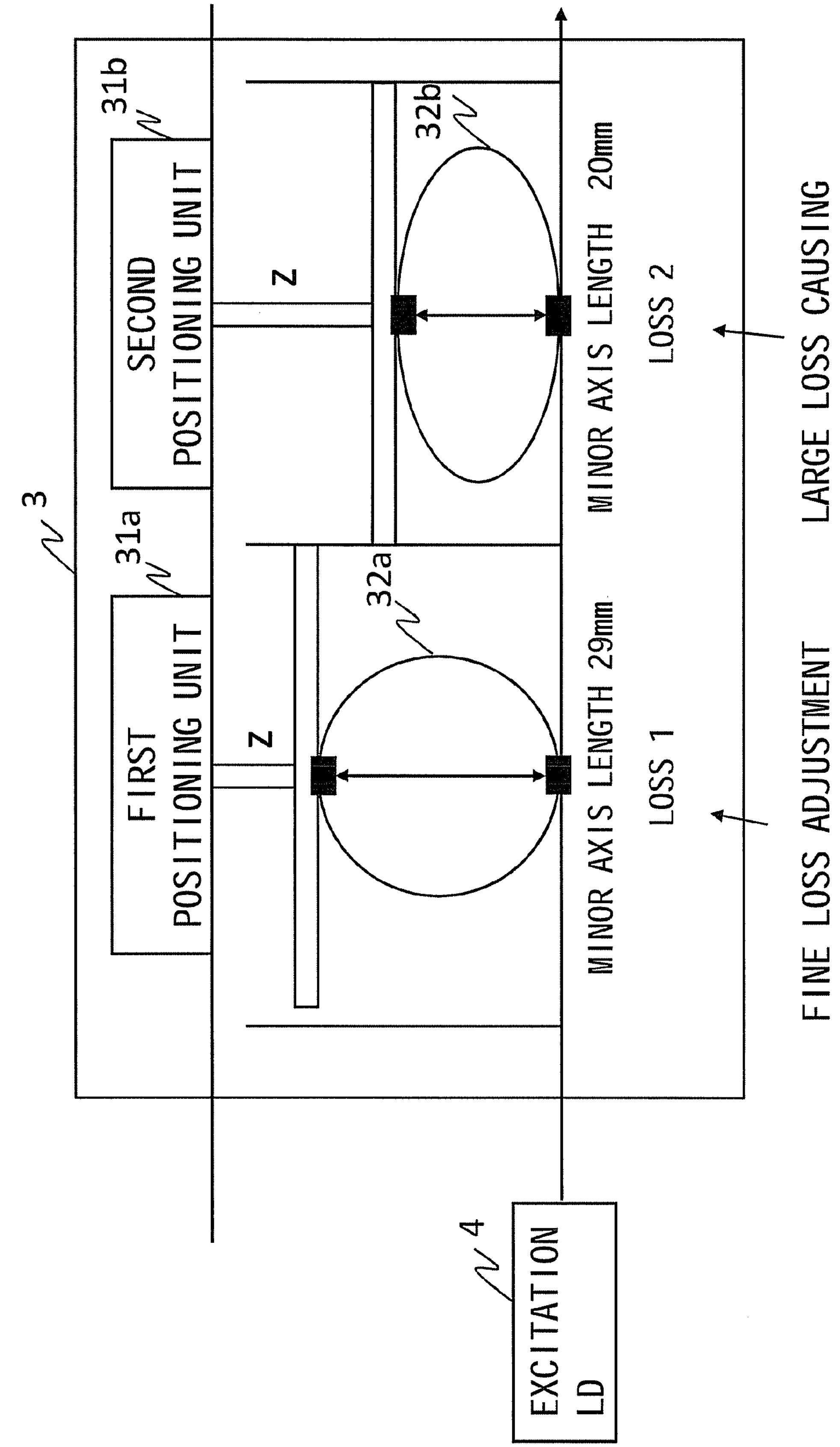
FIG. 11 is a diagram illustrating a structural example of a loss causing unit of a third embodiment.

FIG. 11 illustrates the loss causing unit 3 having two sets each including the positioning unit 31 and the fiber bending unit 32, which are connected in series.

The loss causing unit 3 illustrated in FIG. 11 includes a first fiber bending unit 32*a*, a first positioning unit 31*a* for controlling compression of the first fiber bending unit 32*a*, a second fiber bending unit 32*b*, a second positioning unit 32 for controlling compression of the second fiber bending unit 32*b*.

The second fiber bending unit 32*b* and the second positioning unit 31*b* are used to significantly increase the bending loss in a range in which the bending minor axis length of the second fiber bending unit 32*b* is small. The first fiber bending unit 32*a* and the first positioning unit 31*a* are used to finely adjust the bending loss in a range in which the fiber bending minor axis length of the first fiber bending unit 32*a* is large.

As described above, when the loss causing unit 3 has the two sets each including the positioning unit 31 and the fiber bending unit 32, the bending loss of the optical fiber can be controlled with high precision even in which the range in the loss is large. The loss causing unit 3 may have two or more sets each including the positioning unit 31 and the fiber bending unit 32.

Fourth Embodiment

Figure 12:
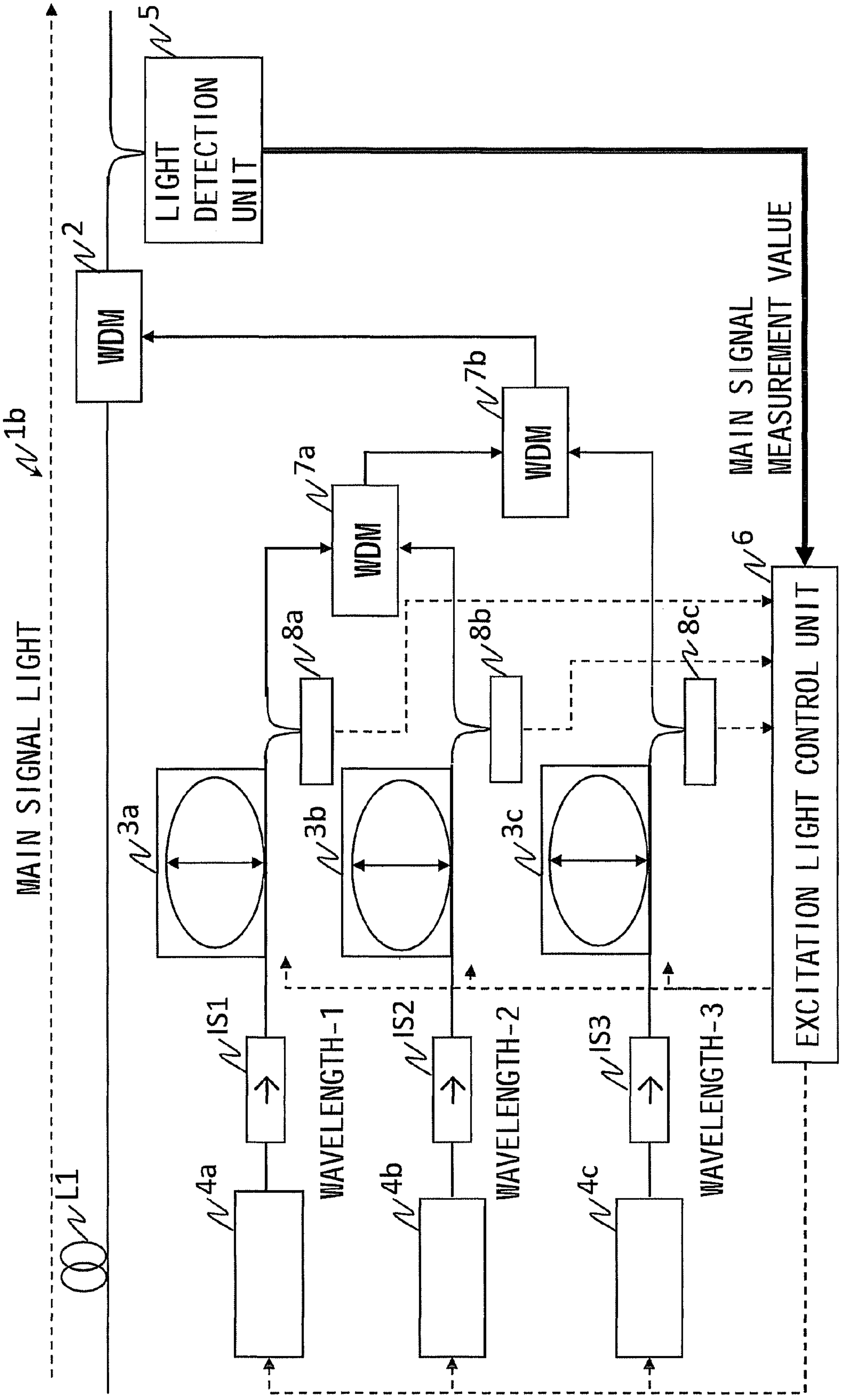
FIG. 12 is a diagram illustrating a structural example of a fourth embodiment.

FIG. 12 is a block diagram illustrating a structural example of a Raman amplifier according to a fourth embodiment. A Raman amplifier 1*b* has a structure common to the first embodiment, and thus different points are mainly described and description of common points are omitted.

The fourth embodiment is different from the first embodiment in that (1) a plurality of excitation light sources are provided, (2) a plurality of loss causing units are provided correspondingly to the plurality of excitation light sources, and (3) excitation light power detection means is provided for each loss causing unit.

The Raman amplifier 1*b* illustrated in FIG. 12 includes excitation lasers 4*a*, 4*b*, and 4*c*, isolators IS1, IS2, and IS3 provided correspondingly to the respective excitation lasers 4, loss causing units 3*a*, 3*b*, and 3*c*, excitation light detection units 8*a*, 8*b*, and 8*c* (corresponding to excitation light detection units), and WDM couplers 7*a* and 7*b* (corresponding to wave combining units) for wave-combining excitation lights from the respective excitation lasers 4.

The excitation lasers 4*a*, 4*b*, and 4*c* output excitation lights having wavelength-1 to wavelength-3 different from one another. In the Raman amplification, a gain is generated at a wavelength obtained by shifting the wavelength of the excitation light to a long-wavelength side by approximately 100 nm. Therefore, the wavelength-1 to the wavelength-3 are set to a wavelength obtained by shifting the wavelength of the main signal light to a short-wavelength side by approximately 100 nm.

The WDM coupler 7*a* multiplexes the excitation light from the excitation laser 4*a* and the excitation light from the excitation laser 4*b*. The WDM coupler 7*b* further multiplexes an excitation light obtained by multiplexing by the WDM coupler 7*a* and the excitation light from the excitation laser 4*c*.

The excitation light detection units 8*a*, 8*b*, and 8*c* are provided between the loss causing units 3*a*, 3*b*, and 3*c* and the WDM couplers 7*a* and 7*b*. The excitation light detection units 8*a*, 8*b*, and 8*c* detect powers of the excitation lights (hereinafter referred to as excitation light-1 to excitation light-3) passing through the loss causing units 3*a*, 3*b*, and 3*c*.

The loss causing units 3*a*, 3*b*, and 3*c* cause losses to the excitation lights output from the corresponding excitation lasers 4*a*, 4*b*, and 4*c* in response to instructions from the excitation light control unit 6. The loss causing units 3*a*, 3*b*, and 3*c* may be the loss causing unit 3 described in any one of the first to third embodiments.

The light detection unit 5 detects the power of the main signal light which is amplified by the excitation light. At this time, signal lights having a plurality of wavelengths are multiplexed in the main signal light, and hence the light detection unit 5 separates the main signal light into the signal lights having the respective wavelengths and measures the powers of the respective signal lights. In the fourth embodiment, the excitation lights having the wavelength1 to the wavelength-3 are guided to the main signal light, and hence the light detection unit 5 detects, for example, power of a signal light having a wavelength larger than the wavelength-1 by 100 nm (referred to as signal light-1), power of a signal light having a wavelength larger than the wavelength-2 by 100 nm (referred to as signal light-2), and power of a signal light having a wavelength larger than the wavelength-3 by 100 nm (referred to as signal light-3).

The excitation light control unit 6 separately and independently controls a driving current value of the excitation laser 4*a* and a fiber bending minor axis length set value of the loss causing unit 3*a*, a driving current value of the excitation laser 4*b* and a fiber bending minor axis length set value of the loss causing unit 3*b*, and a driving current value of the excitation laser 4*c* and a fiber bending minor axis length set value of the loss causing unit 3*c*.

An example of the control method performed by the excitation light control unit 6 is the following method. The excitation light control unit 6 causes the storage unit 65 to store target values of the powers of the signal light-1 to the signal light-3, target values of the powers of the excitation light-1 to the excitation light-3, and conversion tables between fiber bending minor axis lengths and bending losses in the respective loss causing units 3*a*, 3*b*, and 3*c*. Upon receiving measurement values of the powers of the signal light-1 to the signal light-3 from the light detection unit 5, the excitation light control unit 6 calculates target values of the powers of the excitation light-1 to the excitation light-3 based on the target values and the measurement values of the powers of the signal light-1 to the signal light-3 (for example, JP 2002-072262 A). When the target values of the powers of the excitation light-1 to the excitation light-3 are calculated, the target values of the powers of the excitation light-1 to the excitation light-3 which are stored in the storage unit 65 are updated to the calculated new target values.

Next, when the measurement values of the powers of the excitation light-1 to the excitation light-3 are received from the excitation light detection units 8*a*, 8*b*, and 8*c*, the driving current values of the respective excitation lasers 4*a* to 4*c* and the fiber bending minor axis length set values of the respective loss causing units 3*a* to 3*c* are calculated based on the target values and the measurement values of the powers of the excitation light-1 to the excitation light-3. For example, the excitation light control unit 6 performs the control method described in the first embodiment for each excitation light wavelength to obtain the driving current values of the respective excitation lasers 4*a* to 4*c* and the fiber bending minor axis length of the respective loss causing units 3*a* to 3*c*. This can be configured when, in the control method (FIG. 9) described in the first embodiment, the main signal measurement value is substituted for the measurement values of the powers of the excitation light-1 to the excitation-3 and the main signal target value is substituted for the target values of the powers of the excitation light-1 to the excitation light-3.

For example, when the driving current value of the excitation laser 4*a* and the fiber bending minor axis length set value of the loss causing unit 3*a* are to be obtained, the excitation light control unit 6 calculates the target value of the power of the excitation light-1 based on the measurement value of the power of the signal light-1 and the target value of the power of the signal light-1 which are received from the light detection unit 5 (for example, JP 2002-072262 A is performed). The excitation light control unit 6 calculates the driving current value of the excitation laser 4*a* and the fiber bending minor axis length set value of the loss causing unit 3*a* based on the measurement value of the power of the excitation light-1 and the target value of the power of the excitation light-1 which are received from the excitation light detection unit 8*a* (for example, the control method in the first embodiment is performed).

In the fourth embodiment, the plurality of excitation lasers 4 output the plurality of excitation lights having wavelengths different from one another. When the plurality of excitation lights having the different wavelengths are collectively incident on the amplifying medium, the excitation lights having the respective wavelengths have gains in different wavelength bands of the main signal and are optically amplified over a wide band. In such a structure, the loss causing units 3*a* to 3*c* are provided corresponding to the respective excitation lasers 4*a* to 4*c*. Therefore, even when the driving current values of the excitation lasers 4*a* to 4*c* become the lower limit value, the excitation lights having the respective wavelengths can be separately caused to have a fiber loss. Thus, the powers of the excitation lights having the respective wavelengths become lower than the lower limit value, and hence the variable Raman gain range can be widened.

Fifth Embodiment

Figure 13:
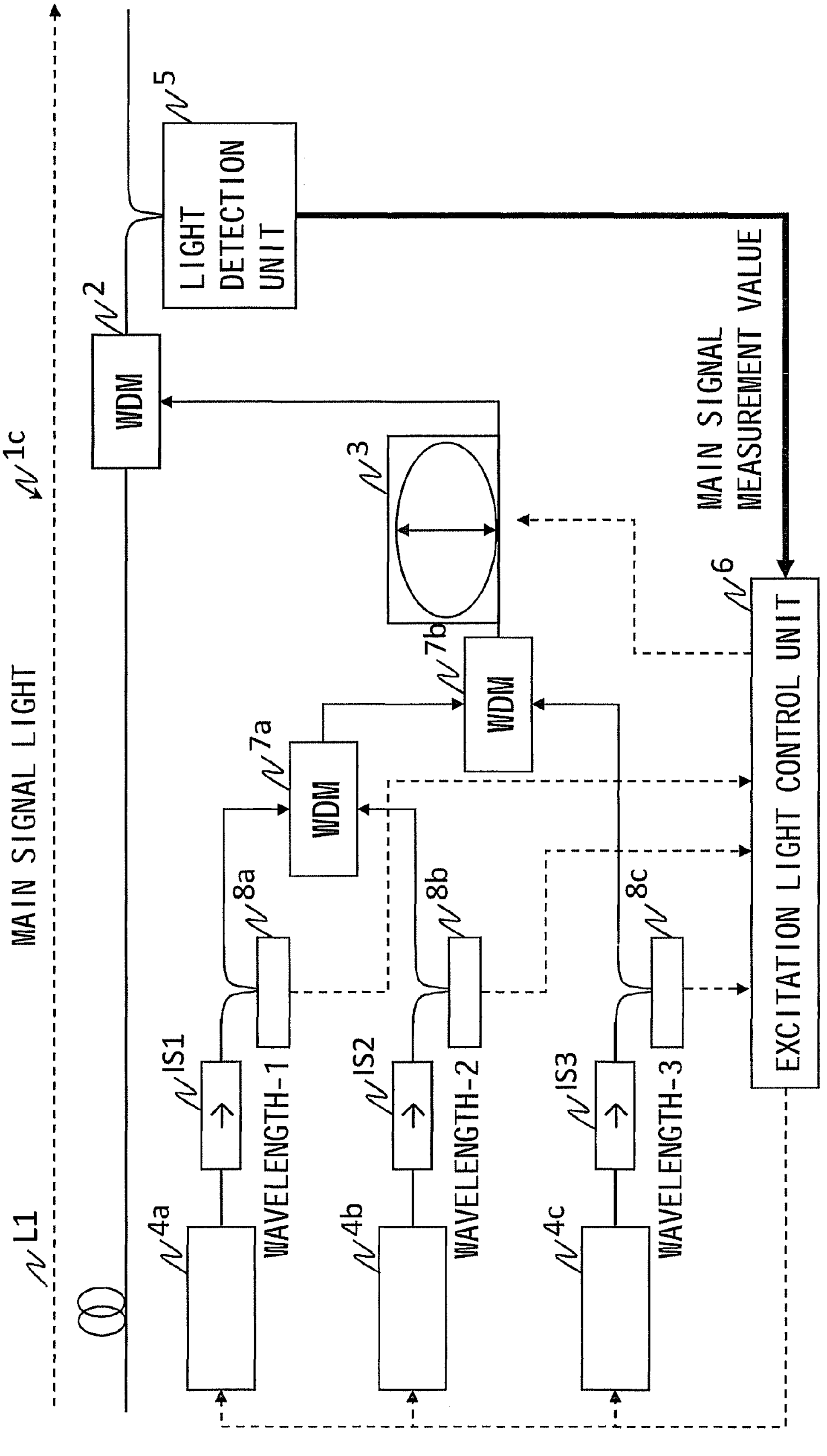
FIG. 13 is a diagram illustrating a structural example of a fifth embodiment.

FIG. 13 is a block diagram illustrating a structural example of a Raman amplifier according to a fifth embodiment. The fifth embodiment is different from the fourth embodiment in the point that a Raman amplifier 1*c* includes only one loss causing unit 3 provided for the plurality of excitation light sources. In the fifth embodiment, the excitation lights having the plurality of wavelengths are multiplexed and then the multiplexed excitation lights are collectively caused to have losses by the loss causing unit 3.

In the fifth embodiment, the excitation lights having the plurality of wavelengths are collectively caused to have losses by bending. In this case, there is a wavelength characteristic in which a generated loss varies according to the wavelength of the excitation light.

Figure 14:
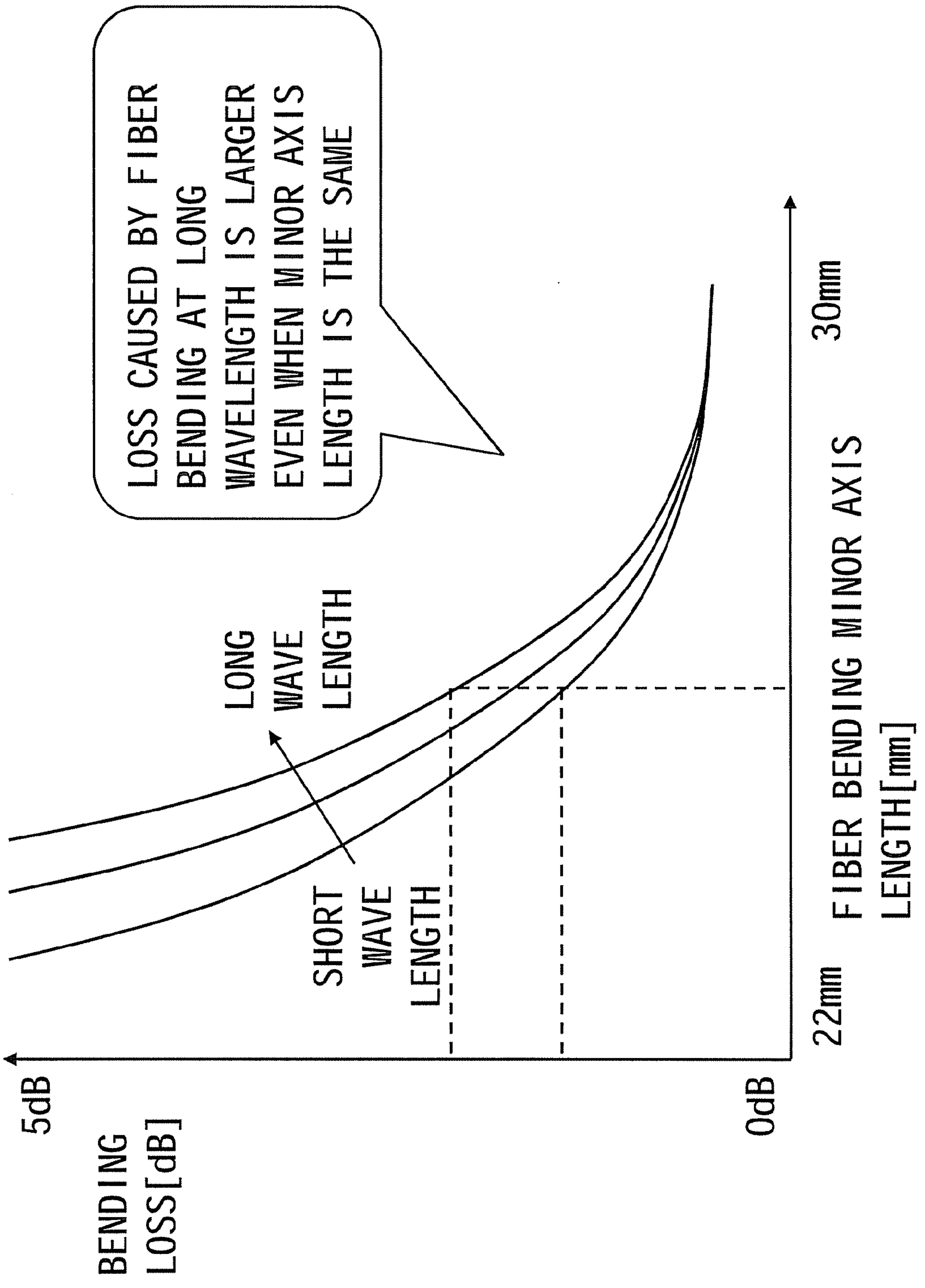
FIG. 14 is a graph illustrating a relationship between the fiber bending minor axis length and the fiber bending loss at each wavelength.

FIG. 14 is a graph illustrating a relationship between the fiber bending minor axis length and the bending loss at each wavelength. The abscissa of the graph of FIG. 14 indicates the fiber bending minor axis length (units of mm) and the ordinate thereof indicates the bending loss (units of dB). FIG. 14 exhibits that the signal light having a longer wavelength is more influenced by the bending loss of the optical fiber. In other words, the loss of the signal light having a longer wavelength becomes larger even in the case of the same fiber bending minor axis length.

Figure 15:
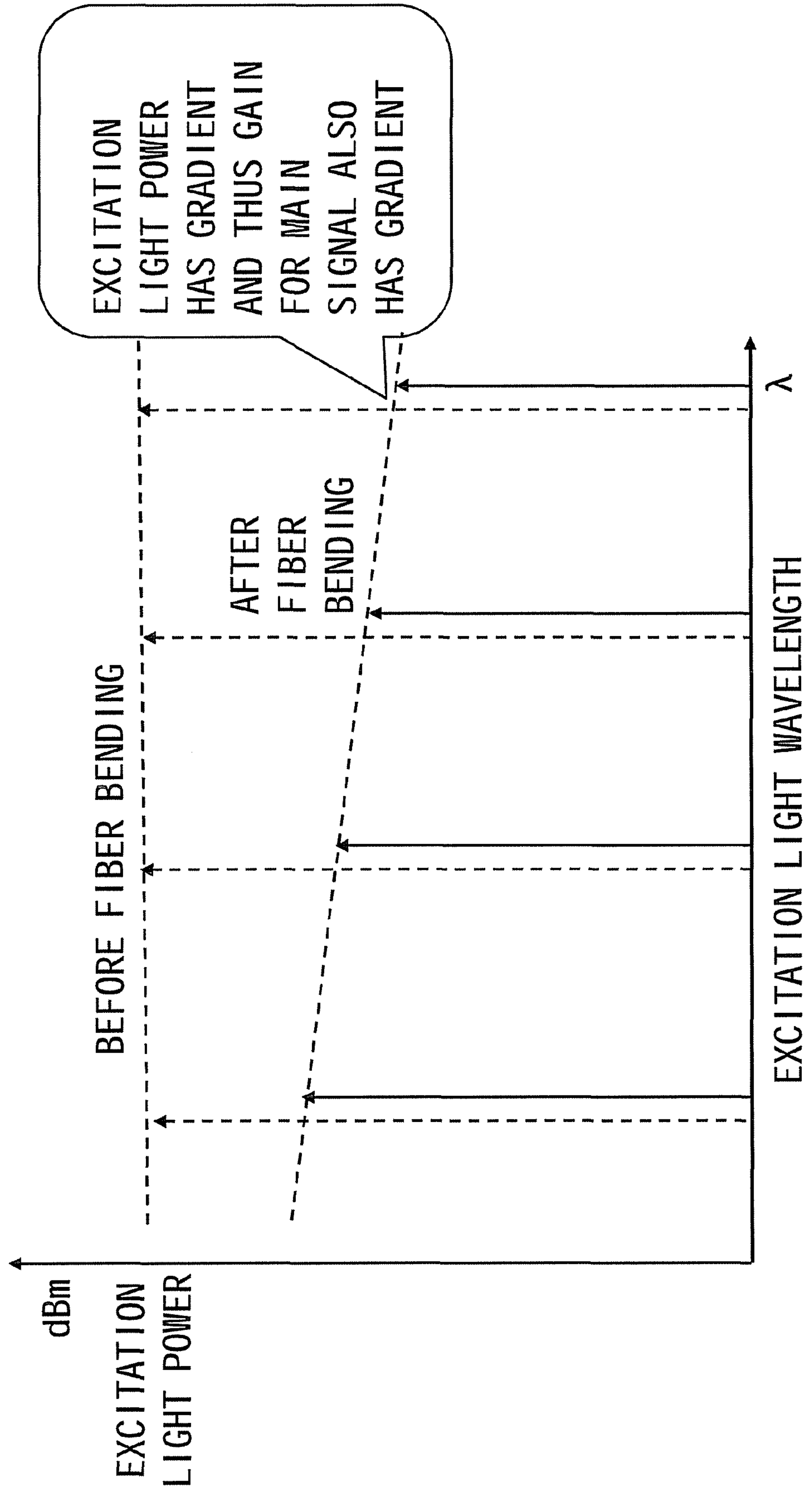
FIG. 15 is a graph illustrating an example of a relationship between an excitation light wavelength and excitation light power.

FIG. 15 illustrates the wavelength of the excitation light and the excitation light power. FIG. 15 includes a graph illustrating wavelength-multiplexed excitation light power in a state in which the bending loss of the loss causing unit 3 can be neglected and a graph illustrating wavelength-multiplexed excitation light power in a state in which the fiber bending minor axis length of the loss causing unit 3 is reduced to increase the bending loss. The abscissa of the graph of FIG. 15 indicates the wavelength of the excitation light and the ordinate thereof indicates the excitation light power. In the state in which the bending loss of the loss causing unit 3 can be neglected (before fiber bending of FIG. 15), substantially the same excitation light power is obtained at any wavelength. In the state in which the fiber bending minor axis length of the loss causing unit 3 is reduced to increase the bending loss (after fiber bending of FIG. 15), as illustrated in FIG. 14, the bending loss increases as the wavelength becomes larger. Therefore, when the wavelength of the excitation light increases, the excitation light power becomes smaller, and hence the excitation light power at a wavelength in a certain wavelength band has a gradient. When the excitation light power has a gradient, a gain of main signal light which depends on the excitation light power also has a gradient. When the main signal light with a gain having a gradient is input to the EDFA provided at the subsequent stage of the Raman amplifier, the main signal light is amplified while the gradient is held. Therefore, the gain of the main signal light is desirably flat and thus the excitation light power is desirably flat.

Figure 16:
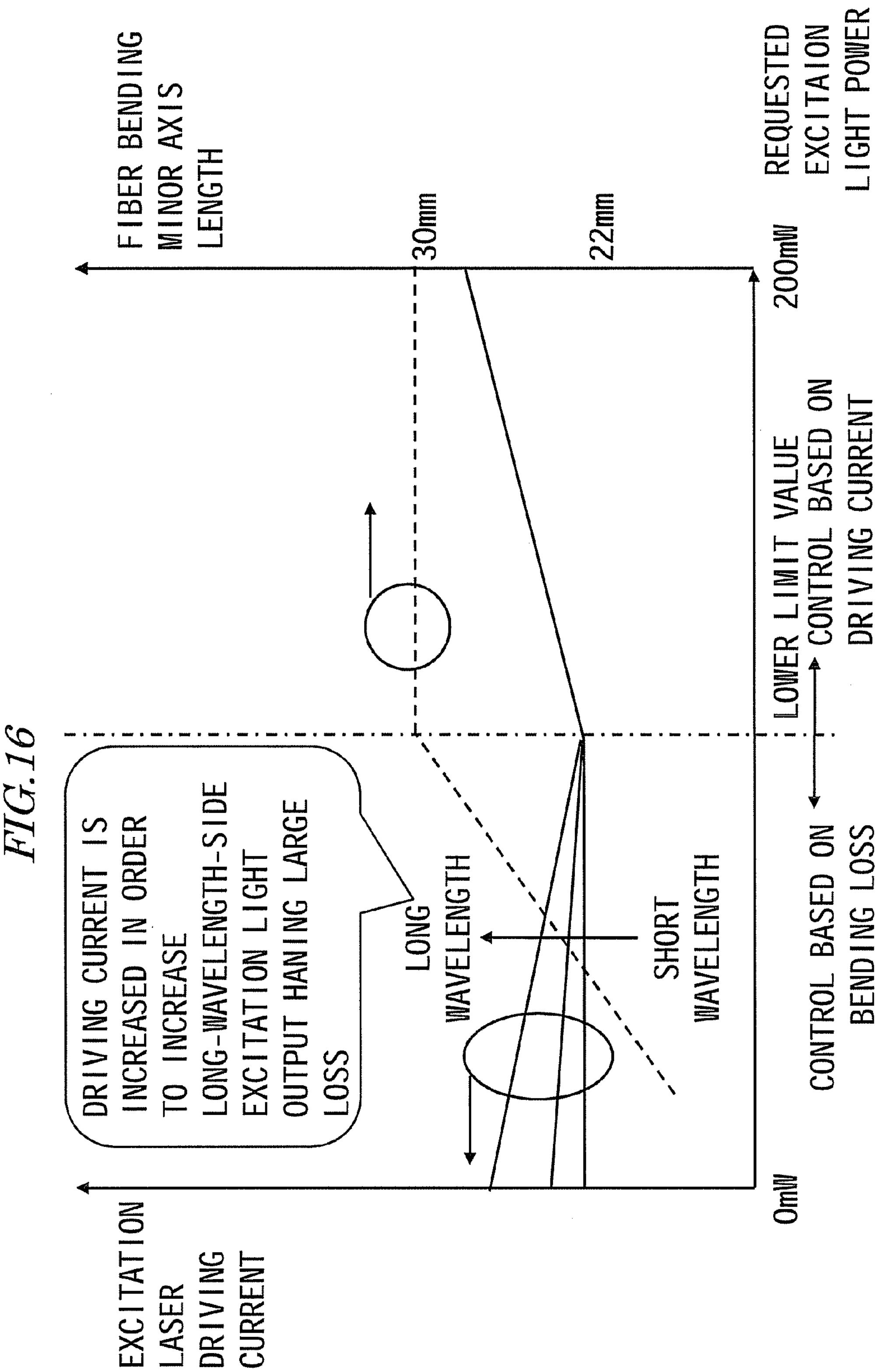
FIG. 16 is a graph illustrating an example of a wavelength characteristic compensation method.

FIG. 16 is a graph illustrating an example of a method of compensating for the wavelength characteristics described in FIGS. 14 and 15. FIG. 16 illustrates a result obtained by simulation in which the powers of the excitation lights having the respective wavelengths (actually, driving current values) are controlled so as to obtain the same bending loss at any wavelength in a case where wavelength-multiplexed excitation lights are collectively caused to have losses by bending. When the output power of the excitation laser 4 is equal to or larger than the lower limit value, the fiber bending minor axis length in which the bending loss can be neglected is held. When the output power of the excitation laser 4 is smaller than the lower limit value, the fiber bending minor axis length is changed and the output power of the excitation light (driving current value) is controlled so as to obtain the same excitation light power loss at each wavelength. The abscissa of FIG. 16 indicates the output power of the excitation light of the excitation LD 4. The ordinate of FIG. 16 indicates the driving current value of the excitation laser 4 and the fiber bending minor axis length. A graph indicated by a single line illustrates a relationship between the output power of the excitation light of the excitation laser 4 and the driving current value of the excitation laser 4. A graph indicated by a broken line illustrates a relationship between the output power of the excitation light of the excitation laser 4 and the fiber bending minor axis length. A vertical line in the graph indicates the lower limit value of the output power of the excitation laser 4. FIG. 16 exhibits that the bending loss is large at a wavelength on a long-wavelength side, and hence the output power of the excitation light (driving current value) is large at a wavelength on the long-wavelength side in the case of the same fiber bending minor axis length. In addition, FIG. 16 exhibits that, when the same bending loss is obtained at the same fiber bending minor axis length, the driving current value of the excitation laser 4 for each wavelength becomes a constant rate. Therefore, when the output power of the excitation light is smaller than the lower limit value (fiber bending loss is increased), a method of increasing the driving current value of the excitation laser 4 on the long-wavelength side at the constant rate is performed as the wavelength characteristic compensation method.

Figure 17:
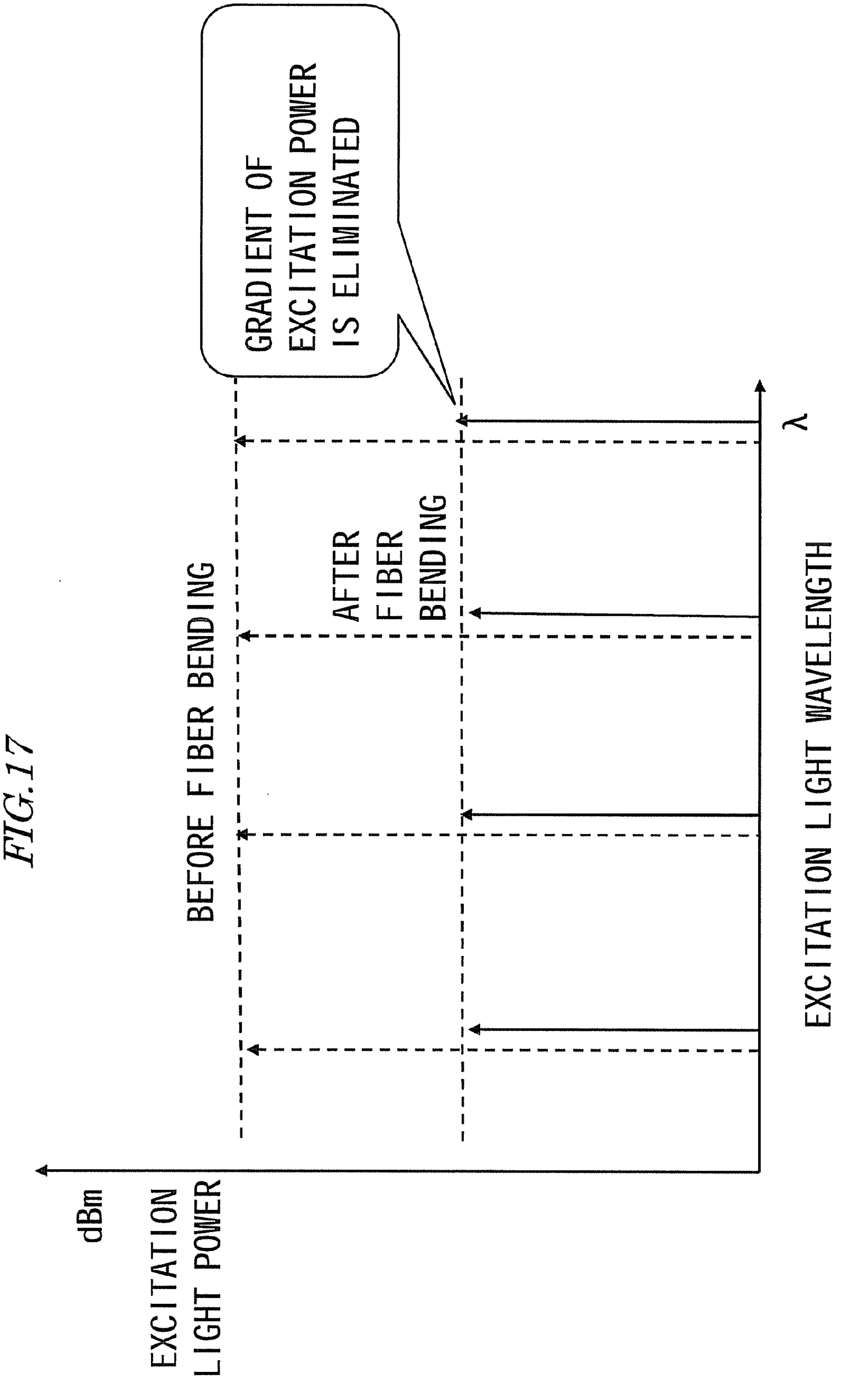
FIG. 17 is a graph illustrating an example of a relationship between the excitation light wavelength and the excitation light power in a case where wavelength characteristic compensation is performed.

FIG. 17 illustrates the wavelength of the excitation light and the excitation light power. FIG. 17 includes a graph illustrating powers of wavelength-multiplexed excitation lights at respective wavelengths in the state in which the bending loss can be neglected and a graph illustrating excitation light powers at respective wavelengths in the state in which a radius of curvature of the optical fiber path is reduced to collectively increase the bending losses to the wavelength-multiplexed excitation lights. In FIG. 17, as described in FIG. 16, when the bending losses to the wavelength-multiplexed excitation lights are collectively increased, the control is performed such that the driving current values are increased at a constant rate according to the wavelengths of the excitation lights. FIG. 17 exhibits that, according to the wavelength characteristic compensation method described in FIG. 16, the excitation light power is flat. Therefore, according to the wavelength characteristic compensation method described in FIG. 16, the gain of the main signal light is also flat.

Returning to FIG. 13, the excitation light detection units 8*a*, 8*b*, and 8*c* are provided between the corresponding isolators IS1, IS2, and IS3 and WDM couplers 7*a* and 7*b*. The excitation light detection units 8*a*, 8*b*, and 8*c* detect the output powers of the excitation lights from the excitation lasers 4*a*, 4*b*, and 4*c*. In this case, the powers of the excitation lights are the powers of the excitation lights (output powers of excitation lights) which do not have losses and are output from the excitation lasers 4*a*, 4*b*, and 4*c*. The output power to the same input current value, of the excitation laser 4 which is a semiconductor laser, is varied because of a temporal change or heat. When the excitation light detection unit 8*a* is provided corresponding to the excitation laser 4, the variation in output power can be detected. Therefore, the driving current is controlled to compensate for the varied output power.

The loss causing unit 3 is provided between the WDM coupler 7*b* and the WDM coupler 2. The loss causing unit 3 causes losses by bending with respect to the excitation lights having the wavelength-1 to the wavelength3 which are multiplexed by the WDM coupler 7*a* and the WDM coupler 7*b* in response to the instructions from the excitation light control unit 6.

As in the second embodiment, the light detection unit 5 measures the powers of the signal light-1 to the signal light-3 included in the main signal light.

The excitation light control unit 6 controls the respective driving current values of the excitation lasers 4*a* to 4*c* and the fiber bending minor axis length set value of the loss causing unit 3. The excitation light control unit 6 performs, for example, the following control method.

The excitation light control unit 6 causes the storage unit 65 to store the target values of the powers of the signal light-1 to the excitation light-3, the target values of the powers of the excitation light-1 to the excitation light-3, the conversion tables between the fiber bending minor axis length and the bending loss in the loss causing unit 3, and a table indicating a relationship between the fiber bending minor axis length and the driving current value of each of the excitation lasers 4 as illustrated in FIG. 16. Note that the target values of the excitation light-1 to the excitation light-3 indicate the target values of the powers of the excitation light-1 to the excitation light-3 immediately before the excitation lights are incident on the WDM coupler 2 and after the excitation lights pass through the loss causing unit 3.

Upon receiving measurement values of the powers of the signal light-1 to the signal light-3 from the light detection unit 5, the excitation light control unit 6 calculates target values of the powers of the excitation light-1 to the excitation light-3 based on the target values and the measurement values of the powers of the signal light-1 to the signal light-3 (for example, JP 2002-072262 A). When the target values of the powers of the excitation light-1 to the excitation light-3 are calculated, the target values of the powers of the excitation light-1 to the excitation light-3 which are stored in the storage unit 65 are updated to the calculated new target values.

Next, when the measurement values of the output powers of the excitation light-1 to the excitation light-3 are received from the excitation light detection units 8*a*, 8*b*, and 8*c*, the driving current values of the respective excitation lasers 4*a* to 4*c* and the fiber bending minor axis length set values of the loss causing unit 3 are calculated based on the target values of the powers of the excitation light-1 to the excitation light-3 and the measurement values of the output powers of the excitation light-1 to the excitation light-3. For example, the excitation light control unit 6 adds a measurement value of the output power of the excitation light-1 to a loss generated by the loss causing unit 3. In this case, the loss generated by the loss causing unit 3 is obtained from the conversion table between the fiber bending minor axis length and the bending loss which are measured in advance. Next, the control method described in the first embodiment is performed for, for example, the shortest wavelength-1 (excitation light-1) to obtain the driving current value of the excitation LD 4*a* and the fiber bending minor axis length of the loss causing unit 3. In this case, the control method (FIG. 9) described in the first embodiment is desirably performed while the main signal measurement value is substituted for a value obtained by subtracting the loss generated by the loss causing unit 3 from the measurement value of the output power of the excitation light-1 and while the main signal target value is substituted for the target value of the power of the excitation light-1.

The control method described in the first embodiment is performed for the wavelength-1 to calculate the driving current value of the excitation laser 4*a* and the fiber bending minor axis length set value of the loss causing unit 3. The driving current values of the excitation lasers 4*b* and 4*c* are calculated based on the calculated fiber bending minor axis length set value. In this case, the driving current values of the excitation lasers 4*b* and 4*c* are desirably calculated using the table indicating the relationship between the fiber bending minor axis length and the driving current value of each of the excitation lasers 4 as illustrated in FIG. 14, which is stored in the storage unit 65. That is, when the control is performed to cause losses with respect to the excitation lights by the loss causing unit 3 (control is performed to change fiber bending minor axis length), for example, the driving current values of the excitation lasers 4*b* and 4*c* are set to driving current values increased by constant rates based on the driving current value of the excitation laser 4*a* having the shortest wavelength.

The output powers of the excitation lasers 4*a* to 4*c* are increased with the driving current values. Therefore, when the fiber bending minor axis length is controlled, the respective driving current values of the excitation lasers 4*a* to 4*c* have the constant rates measured in advance. When the bending loss of the loss causing unit 3 can be sufficiently neglected, the same value is obtained. However, the excitation laser 4 does not constantly necessarily output the same excitation light at a certain driving current value, and the output varies because of a temporal change or temperature. Thus, the excitation light control unit 6 monitors the measurement values of the output powers of the excitation lasers 4*a* to 4*c* from the excitation light detection units 8*a* to 8*c*, and controls the driving current values of the respective excitation lasers 4 to compensate for the over and under amount of the output power when the constant rates are not held.

As in the fifth embodiment, when the excitation lights obtained by multiplexing the excitation lights-1 to the excitation light-3 are to be collectively caused to have losses by fiber bending, the single loss causing unit 3 is desirably provided. Therefore, cost can be reduced as compared with the fourth embodiment.

Sixth Embodiment

Figure 18:
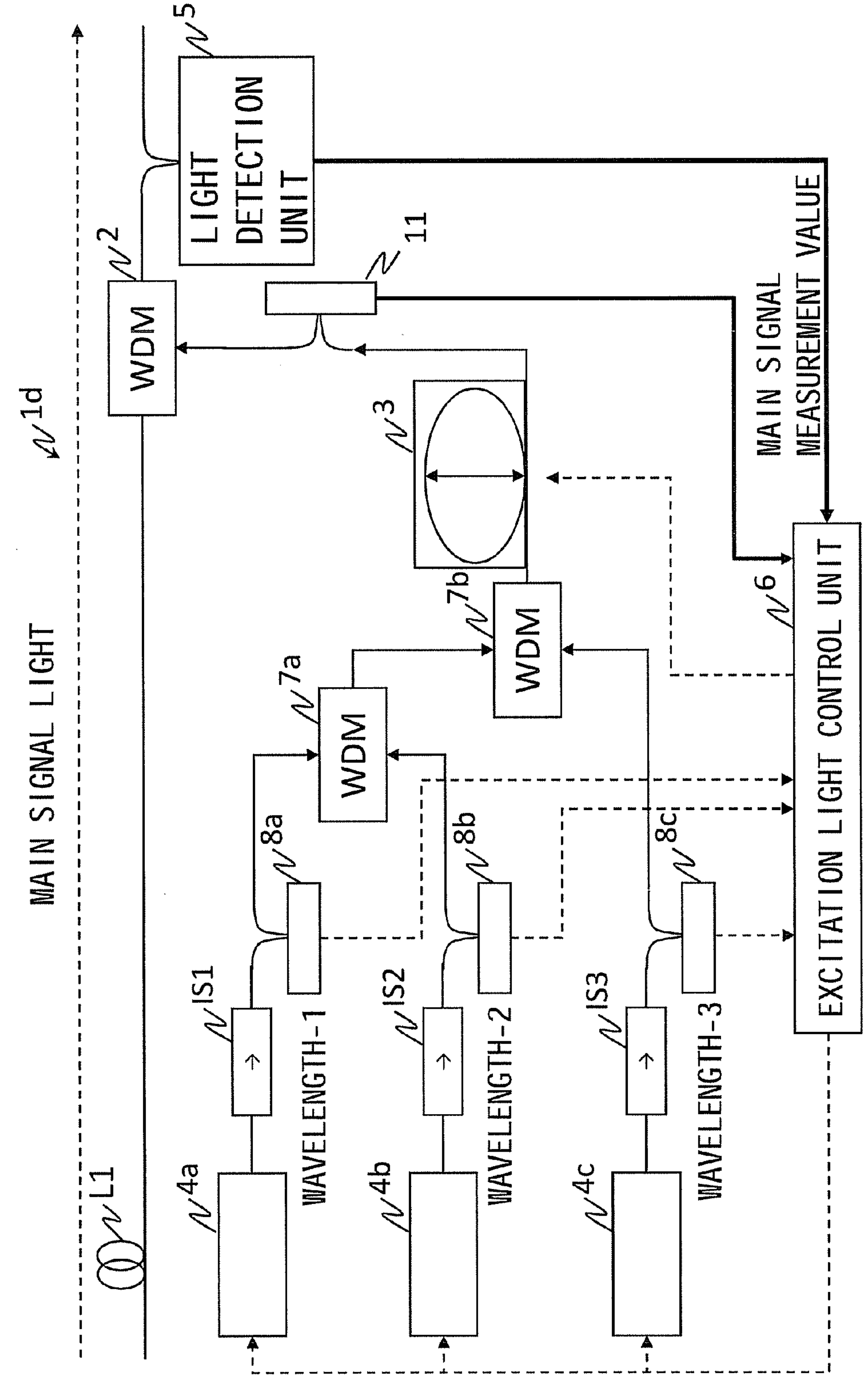
FIG. 18 is a diagram illustrating a structural example of a sixth embodiment.

FIG. 18 is a diagram illustrating a structural example of a Raman amplifier according to a sixth embodiment. In addition to the structural example described in the fifth embodiment, a Raman amplifier id further includes an excitation light detection unit 11 (corresponding to wave-combined light detection unit) provided between the loss causing unit 3 and the WDM coupler 2.

The excitation light detection unit 11 detects the powers of the multiplexed excitation lights including the wavelength-1 to the wavelength-3 which pass through the loss causing unit 3. In this case, the excitation light detection unit 11 detects the excitation light powers of the excitation light-1 to the excitation light-3.

The excitation light control unit 6 controls the respective driving current values of the excitation lasers 4*a* to 4*c* and the fiber bending minor axis length set value of the loss causing unit 3. The excitation light control unit 6 performs, for example, the following control method.

The excitation light control unit 6 causes the storage unit 65 to store the target values of the powers of the signal light-1 to the signal light-3, the target values of the powers of the excitation light-1 to the excitation light-3, the conversion tables between the fiber bending minor axis length and the bending loss in the loss causing unit 3, and a table indicating a relationship between the fiber bending minor axis length and the driving current value of each of the excitation lasers 4 as illustrated in FIG. 16. Note that the target values of the excitation light-1 to the excitation light-3 indicate the target values of the powers of the excitation light-1 to the excitation light-3 immediately before the lights are incident on the WDM coupler 2 and after the lights pass through the loss causing unit 3.

Upon receiving measurement values of the powers of the signal light-1 to the signal light-3 from the light detection unit 5, the excitation light control unit 6 calculates target values of the powers of the excitation light-1 to the excitation light-3 based on the target values and the measurement values of the powers of the signal light-1 to the signal light-3 (for example, JP 2002-072262 A). When the target values of the powers of the excitation light-1 to the excitation light-3 are calculated, the target values of the powers of the excitation light-1 to the excitation light-3 which are stored in the storage unit 65 are updated to the calculated new target values.

Next, when the measurement values of the powers of the excitation light-1 to the excitation light-3 are received from the excitation light detection unit 11, the driving current values of the respective excitation lasers 4*a* to 4*c* and the fiber bending minor axis length set value of the loss causing unit 3 are calculated based on the target values and the measurement values of the powers of the excitation light-1 to the excitation light-3. Next, the control method described in the first embodiment is performed for, for example, the shortest wavelength-1 (excitation light-1) to obtain the driving current value of the excitation laser 4*a* and the fiber bending minor axis length of the loss causing unit 3. In this case, the control method described in the first embodiment is desirably performed while the main signal measurement value is substituted for the measurement value of the power of the excitation light-1 and while the main signal target value is substituted for the target value of the power of the excitation light-1.

After that, as in the control method described in the third embodiment, the respective excitation light lasers 4 and the fiber bending minor axis length of the loss causing unit 3 are calculated.

When the excitation light detection unit 11 is further provided between the loss causing unit 3 and the WDM coupler 2 as in the sixth embodiment, control with higher precision can be performed because the measurement values of the powers of the excitation lights actually passing through the loss causing unit 3 are used, unlike the use of the value estimated by measuring in advance the loss generated by the loss causing unit 3 in the fifth embodiment.

MODIFIED EXAMPLE

In the first to sixth embodiments, the fiber bending unit 32 of the loss causing unit 3 is compressed to change the radius of curvature, thereby generating the bending loss. Instead of this, the fiber bending unit 32 may be extended to change the radius of curvature, thereby generating the bending loss.

In the fourth to sixth embodiments, the excitation light-1 to the excitation light-3 are wavelength-multiplexed by the WDM coupler 7*a* and the WDM coupler 7*b*. A polarization combining coupler may be used instead of the WDM coupler 7*a* and the WDM coupler 7*b*.

In the fifth and sixth embodiments, a photo detector with tap is used as each of the excitation light detection units 8a to 8c for detecting the output powers of the excitation lasers 4. Instead of this, a back power monitor of a semiconductor laser which is the excitation laser may be used. The semiconductor laser is provided with the back power monitor. Therefore, when the back power monitor is used, it is unnecessary to provide additional detection means, and hence a cost can be reduced.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

<Note>

According to an aspect of the invention, a light output control apparatus includes:

an excitation light source that outputs excitation light;

an excitation light guiding unit that guides the excitation light to an optical amplifying medium transmitting signal light; and a loss causing unit that includes an optical transmission medium located between the excitation light source and the excitation light guiding unit, and changes a radius of curvature of the optical transmission medium.

According to the disclosed light output control apparatus, when the radius of curvature of the optical transmission medium is changed, a loss can be caused in the transmitted light. Therefore, when the excitation light source outputs the excitation light at a lower limit value of output power, excitation light power can be reduced to a value lower than the lower limit value of the output power of the excitation light source, with the result that a gain range of the light output control apparatus can be increased.

According to an aspect of the invention, a light output control apparatus may include:

a plurality of excitation light sources that output excitation lights having different wavelengths from one another;

a wave combining unit that combines the excitation lights from the plurality of excitation light sources;

a plurality of loss causing units, each of which includes an optical transmission medium located between each of the plurality of excitation light sources and the wave combining unit, and changes a radius of curvature of the optical transmission medium;

a plurality of excitation light detection units, each of which is located between each of the plurality of loss causing units and the wave combining unit, and detects an intensity of each of the excitation lights which are output from the plurality of excitation light sources and pass through the corresponding loss causing units;

an excitation light guiding unit that guides, to an optical amplifying medium for transmitting a signal light, the excitation light combined by the wave combining unit;

a light detection unit that detects an intensity of light passing through the optical amplifying medium; and a control unit that performs control such that the intensity of the light which is obtained from the light detection unit becomes a target value, based on the intensity of the light which is obtained from the light detection unit and the intensity of the each of the excitation lights from the respective excitation light sources, which is obtained from each of the plurality of excitation light detection units, wherein the control unit performs, when a control value of one of the excitation light sources is a lower limit value and the intensity of the light is larger than the target value, control to reduce a radius of curvature of the optical transmission medium in the corresponding loss causing unit to a value lower than a value in a normal state, and the control unit holds, when the control value of one of the excitation light sources is larger than the lower limit value, the radius of curvature of the optical transmission medium in the corresponding loss causing unit to a normal state.

According to an aspect of the invention, a light output control apparatus may include:

a plurality of excitation light sources that output excitation lights having different wavelengths from one another;

a wave combining unit that combines the excitation lights from the plurality of excitation light sources;

an excitation light guiding unit that guides, to an optical amplifying medium for transmitting a signal light, the excitation light combined by the wave combining unit;

a loss causing unit that includes an optical transmission medium located between the wave combining unit and the excitation light guiding unit, and changes a radius of curvature of the optical transmission medium;

a plurality of excitation light detection units, each of which is located between each of the plurality of excitation light sources and the wave combining unit, and detects an intensity of each of the excitation lights which are output from the plurality of excitation light sources;

a light detection unit that detects an intensity of light passing through the optical amplifying medium; and a control unit that performs control such that the intensity of the light which is obtained from the light detection unit becomes a target value, based on the intensity of the light which is obtained from the light detection unit and the intensity of the each of the excitation lights from the respective excitation light sources, which is obtained from each of the plurality of excitation light detection units, wherein the control unit performs, when a control value of a reference excitation light source among the plurality of the excitation light sources is a lower limit value, control to reduce a radius of curvature of the optical transmission medium in the loss causing unit to a value lower than a value in a normal state and to set the control value of the each of the plurality of excitation light sources at a predetermined ratio, and the control unit holds, when the control value of the reference excitation light source is larger than the lower limit value, the radius of curvature of the optical transmission medium in the loss causing unit in the normal state.

The plurality of excitation light sources are provided, and hence a gain is obtained over a wide band and a variable Raman amplification gain range can be increased.

According to the disclosed apparatus, there is provided a technology for stably operating an excitation light source in a case of a minimum gain and increasing a Raman amplification gain range.

What is claimed is:

1. A light output control apparatus, comprising:

an excitation light source that outputs excitation light;

an excitation light guiding unit that guides the excitation light to an optical amplifying medium for transmitting a signal light; and a loss causing unit that includes an optical transmission medium located between the excitation light source and the excitation light guiding unit, and changes a radius of curvature of the optical transmission medium so that the loss causing unit outputs the excitation light whose control value is less than a lower limit value of the excitation light source.

2. The light output control apparatus according to claim 1, further comprising:

a light detection unit that detects an intensity of light passing through the optical amplifying medium; and a control unit that controls the excitation light source and the loss causing unit such that the intensity of the light, which is obtained from the light detection unit, becomes a target value, wherein the control unit controls, when the control value of the excitation light source is the lower limit value and the intensity of the light is larger than the target value, the radius of curvature of the optical transmission medium in the loss causing unit, and the control unit holds, when the control value of the excitation light source is larger than the lower limit value, the radius of curvature of the optical transmission medium in the loss causing unit in a normal state.

3. A light output control apparatus, comprising:

a plurality of excitation light sources that output excitation lights having different wavelengths from one another;

a wave combining unit that combines the excitation lights from the plurality of excitation light sources;

a plurality of loss causing units, each of which includes an optical transmission medium located between each of the plurality of excitation light sources and the wave combining unit, and changes a radius of curvature of the optical transmission medium;

a plurality of excitation light detection units, each of which is located between each of the plurality of loss causing units and the wave combining unit, and detects an intensity of each of the excitation light which are output from the plurality of excitation light sources and pass through the corresponding loss causing units;

an excitation light guiding unit that guides, to an optical amplifying medium for transmitting a signal light, excitation light combined by the wave combining unit;

a light detection unit that detects an intensity of light passing through the optical amplifying medium; and a control unit that performs control such that the intensity of the light which is obtained from the light detection unit becomes a target value, based on the intensity of the light which is obtained from the light detection unit and the intensity of the each of the excitation light from the respective excitation light sources, which is obtained from each of the plurality of excitation light detection units, wherein the control unit performs, when a control value of one of the excitation light sources is a lower limit value and the intensity of the light is larger than the target value, control to reduce a radius of curvature of the optical transmission medium in the corresponding loss causing unit to a value lower than a value in a normal state, and the control unit holds, when the control value of one of the excitation light sources is larger than the lower limit value, the radius of curvature of the optical transmission medium in the corresponding loss causing unit to a normal state.

4. A light output control apparatus comprising:

a plurality of excitation light sources that output excitation lights having different wavelengths from one another;

a wave combining unit that combines the excitation lights from the plurality of excitation light sources;

an excitation light guiding unit that guides, to an optical amplifying medium for transmitting a signal light, the excitation light combined by the wave combining unit;

a loss causing unit that includes an optical transmission medium located between the wave combining unit and the excitation light guiding unit, and changes a radius of curvature of the optical transmission medium;

a plurality of excitation light detection units, each of which is located between each of the plurality of excitation light sources and the wave combining unit, and detects an intensity of each of the excitation lights which are output from the plurality of excitation light sources;

a light detection unit that detects an intensity of light passing through the optical amplifying medium; and a control unit that performs control such that the intensity of the light which is obtained from the light detection unit becomes a target value, based on the intensity of the light which is obtained from the light detection unit and the intensity of the each of the excitation lights from the respective excitation light sources, which is obtained from each of the plurality of excitation light detection units, wherein the control unit performs, when a control value of a reference excitation light source among the plurality of the excitation light sources is a lower limit value, control to reduce a radius of curvature of the optical transmission medium in the loss causing unit to a value lower than a value in a normal state and to set the control value of the each of the plurality of excitation light sources at a predetermined ratio, and the control unit holds, when the control value of the reference excitation light source is larger than the lower limit value, the radius of curvature of the optical transmission medium in the loss causing unit in the normal state.

5. The light output control apparatus according to claim 4, further comprising a wave-combined light detection unit that is located between the loss causing unit and the excitation light guiding unit, and detects an intensity of excitation light which is obtained by combining the excitation lights output from the plurality of excitation light sources by the wave combining unit and passes through the loss causing unit, wherein the control unit refers to the intensity of the light which is obtained from the light detection unit, the intensity of the each of the excitation lights which are output from the plurality of excitation light sources and obtained from the each of the plurality of excitation light detection units, and the intensity of the excitation light which passes through the loss causing unit and is obtained from the wave-combined light detection unit such that the intensity of the light which is obtained from the light detection unit becomes the target value, the control unit performs, when the control value of the reference excitation light source among the plurality of the excitation light sources is the lower limit value, control to reduce the radius of curvature of the optical transmission medium in the loss causing unit to a value lower than a value in the normal state and to set the control value of the each of the plurality of excitation light sources at a predetermined ratio, and the control unit holds, when the control value of the reference excitation light source is larger than the lower limit value, the radius of curvature of the optical transmission medium in the loss causing unit in the normal state.

6. The light output control apparatus according to claim 1, wherein the loss causing unit includes an optical transmission medium wound a plurality of times.

7. The light output control apparatus according to claim 1, wherein the loss causing unit includes a plurality of optical transmission media which are bent in a circular shape, arranged in series, and each have a radius of curvature separately changed.

8. An optical fiber Raman amplifier, comprising:

an excitation light source that outputs excitation light;

an excitation light guiding unit that guides the excitation light to an optical amplifying medium; and a loss causing unit that includes an optical transmission medium located between the excitation light source and the excitation light guiding unit, and changes a radius of curvature of the optical transmission medium so that the loss causing unit outputs the excitation light whose control value is less than a lower limit value of the excitation light source.

* * * * *